US010373697B1

(12) United States Patent
Lai et al.

(10) Patent No.: US 10,373,697 B1
(45) Date of Patent: Aug. 6, 2019

(54) PROGRAMMING DUMMY MEMORY CELLS IN ERASE OPERATION TO REDUCE THRESHOLD VOLTAGE DOWNSHIFT FOR SELECT GATE TRANSISTORS

(71) Applicant: SanDisk Technologies LLC, Plano, TX (US)

(72) Inventors: Chun-Hung Lai, Kamakura (JP); Rajdeep Gautam, Yokohama (JP); Ching-Huang Lu, Fremont, CA (US); Shih-Chung Lee, Yokohama (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/897,550

(22) Filed: Feb. 15, 2018

(51) Int. Cl.
| | |
|---|---|
| *G11C 16/06* | (2006.01) |
| *G11C 16/34* | (2006.01) |
| *G11C 16/16* | (2006.01) |
| *G11C 16/04* | (2006.01) |
| *G11C 11/56* | (2006.01) |
| *G11C 7/14* | (2006.01) |

(52) U.S. Cl.
CPC ........... *G11C 16/3445* (2013.01); *G11C 7/14* (2013.01); *G11C 11/5635* (2013.01); *G11C 16/0483* (2013.01); *G11C 16/16* (2013.01)

(58) Field of Classification Search
CPC ... G11C 16/3445; G11C 7/14; G11C 11/5635; G11C 16/0483; G11C 16/16
See application file for complete search history.

(56) References Cited

U.S. PATENT DOCUMENTS

| | | | |
|---|---|---|---|
| 7,616,496 B2 | 11/2009 | Choi et al. | |
| 8,670,285 B2 | 3/2014 | Dong et al. | |
| 9,218,874 B1 | 12/2015 | Koh et al. | |
| 9,312,010 B1 | 4/2016 | Yuan et al. | |
| 9,324,439 B1 | 4/2016 | Chen et al. | |
| 9,361,993 B1 | 6/2016 | Chen et al. | |
| 9,406,387 B2 | 8/2016 | Yuan et al. | |
| 9,627,078 B2 * | 4/2017 | Jeon ................... | G11C 16/0483 |

(Continued)

OTHER PUBLICATIONS

Yeh, Chih-Chieh, et al., "A Novel Erase Scheme to Suppress Overerasure in a Scaled 2-Bit Nitride Storage Flash Memory Cell," IEEE Electron Device Letters, vol. 25, No. 9, Sep. 2004, 3 pages.

(Continued)

*Primary Examiner* — Pho M Luu
(74) *Attorney, Agent, or Firm* — Vierra Magen Marcus LLP

(57) ABSTRACT

Apparatuses and techniques are described for reducing charge loss in a select gate transistor in a memory device. In one aspect, a dummy memory cell adjacent to a select gate transistor is weakly programmed during an erase operation by applying a program pulse to the dummy memory cell. The program pulse can be applied after an erase bias is applied to the memory cells and before an erase-verify test is performed, in one approach. The program pulse can be applied during the setup of the voltages for the erase-verify test. The magnitude of the program pulse can be increased in successive erase loops of an erase operation as the magnitude of a substrate voltage is also increased. The magnitude of the program pulse can also be set as an increasing function of a number of program-erase (P-E) cycles.

20 Claims, 21 Drawing Sheets

(56) References Cited

U.S. PATENT DOCUMENTS

| | | | |
|---|---|---|---|
| 9,659,664 B1 | 5/2017 | Griffin et al. | |
| 9,704,588 B1 | 7/2017 | Ray et al. | |
| 9,786,378 B1 | 10/2017 | Zhang et al. | |
| 9,830,963 B1 | 11/2017 | Pang et al. | |
| 9,941,000 B2 * | 4/2018 | Perner | G11C 16/08 |
| 10,008,271 B1 * | 6/2018 | Diep | G11C 16/10 |
| 2007/0036001 A1 | 2/2007 | Kanda et al. | |
| 2012/0033503 A1 | 2/2012 | Kim et al. | |
| 2012/0275223 A1 | 11/2012 | Baek | |

OTHER PUBLICATIONS

U.S. Appl. No. 15/693,982, filed Sep. 1, 2017, by Diep et al.
U.S. Appl. No. 15/403,710, filed Jan. 11, 2017, by Zhang et al.

\* cited by examiner

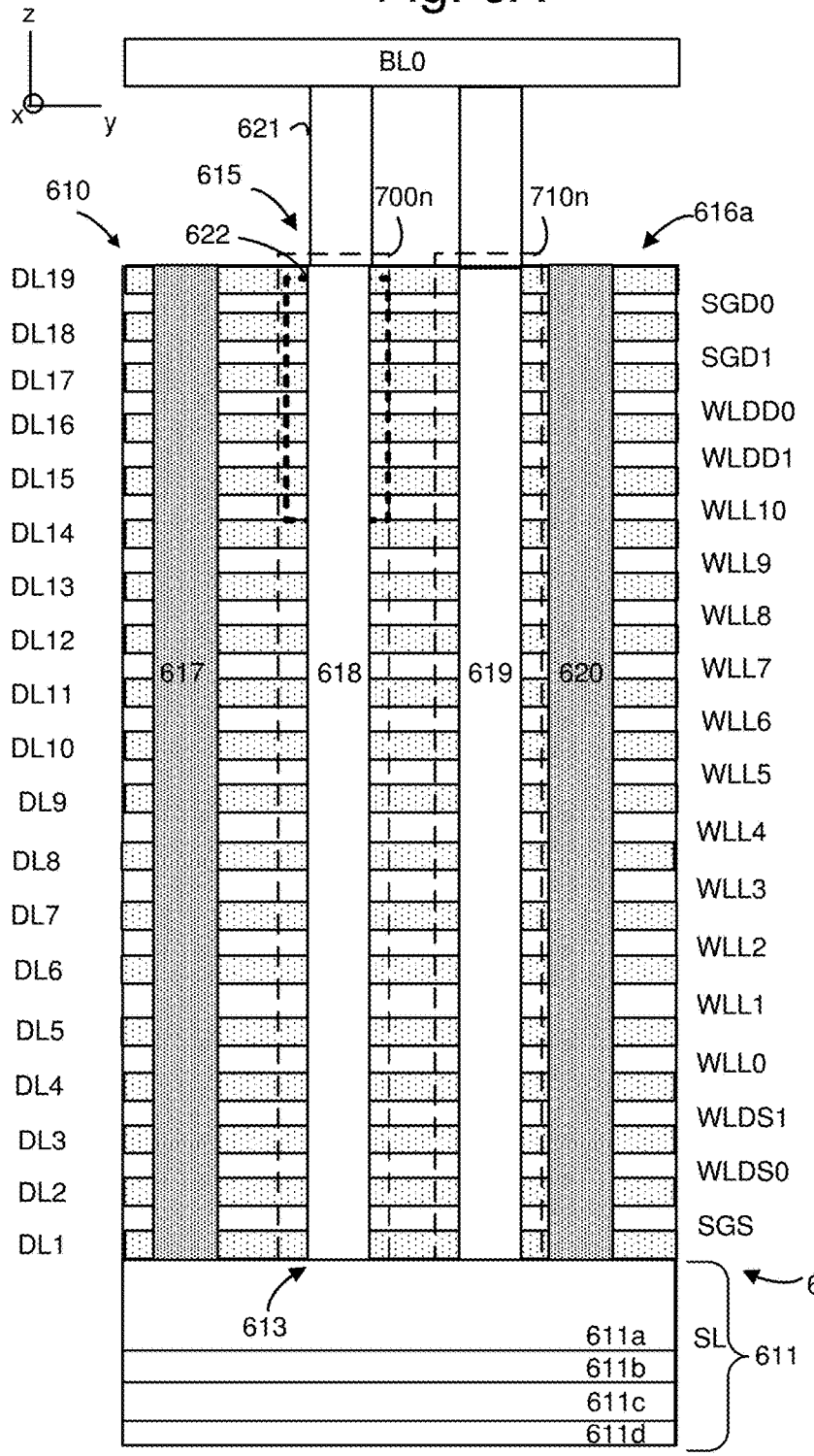
Fig. 6A
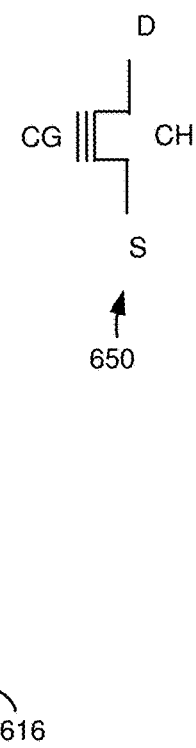
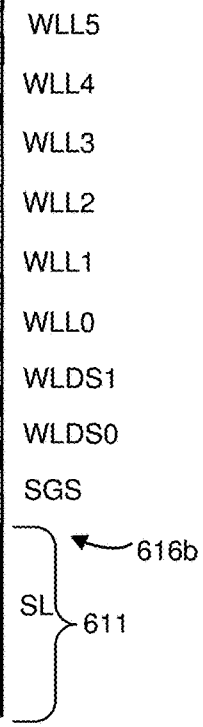
Fig. 6B

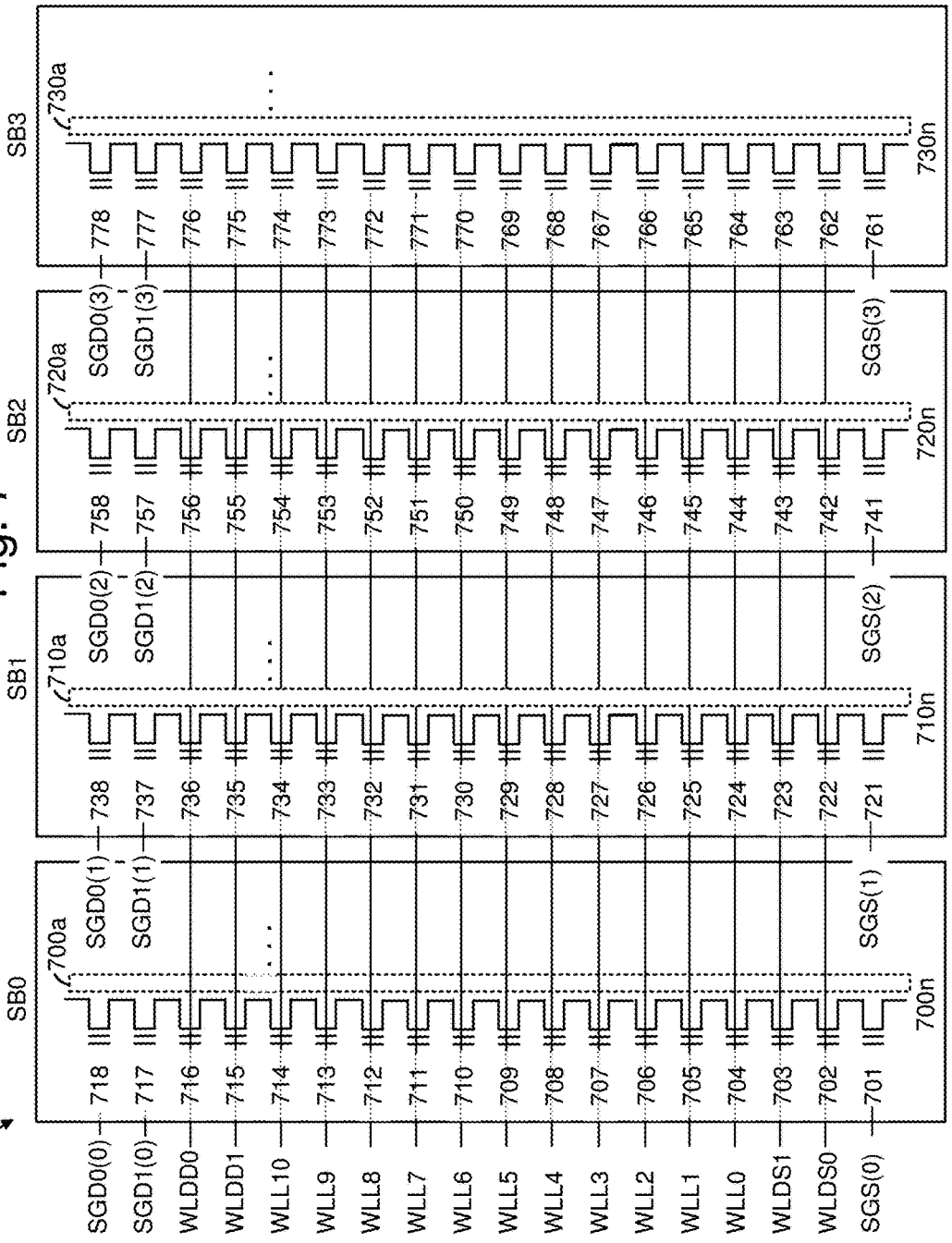

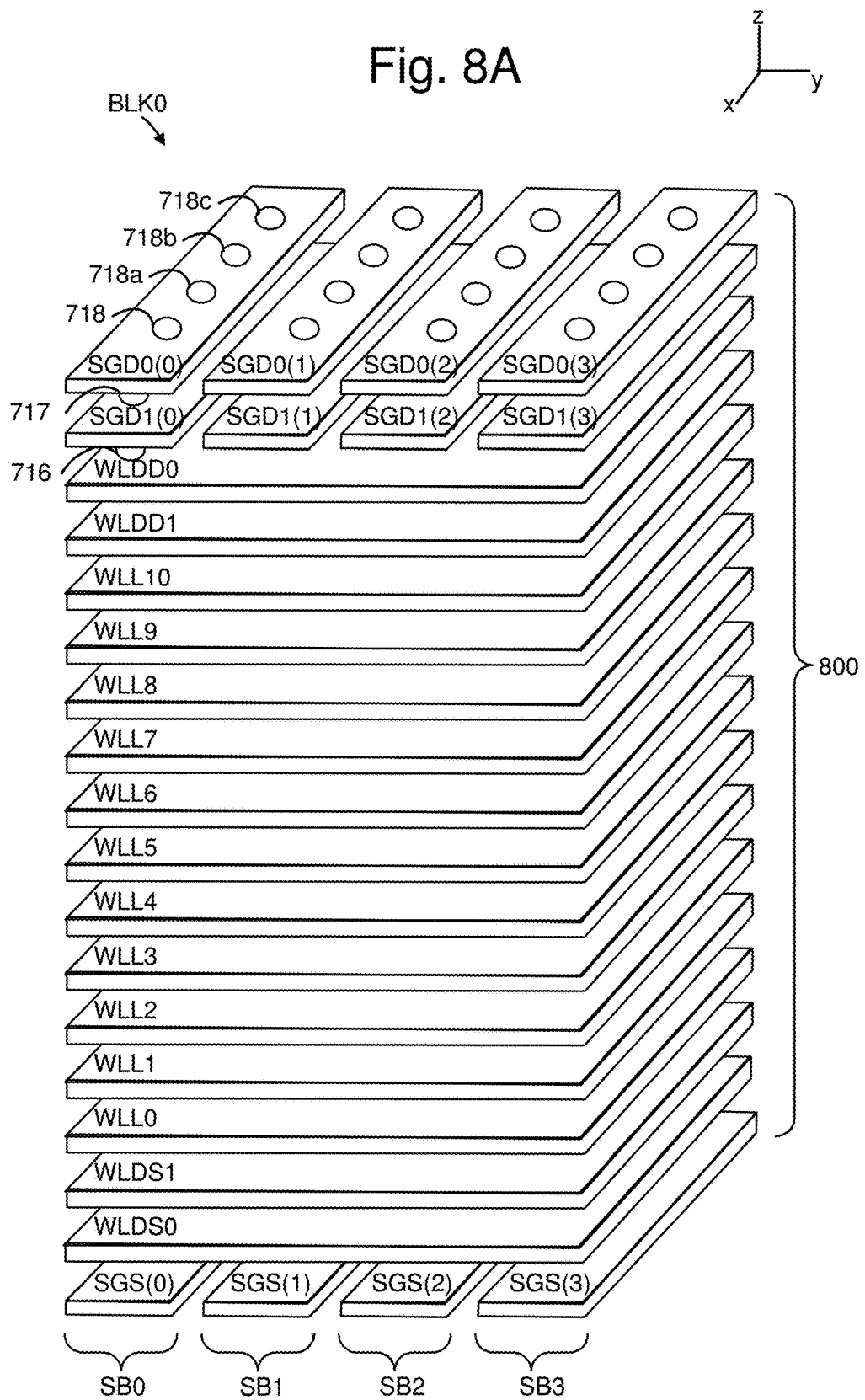

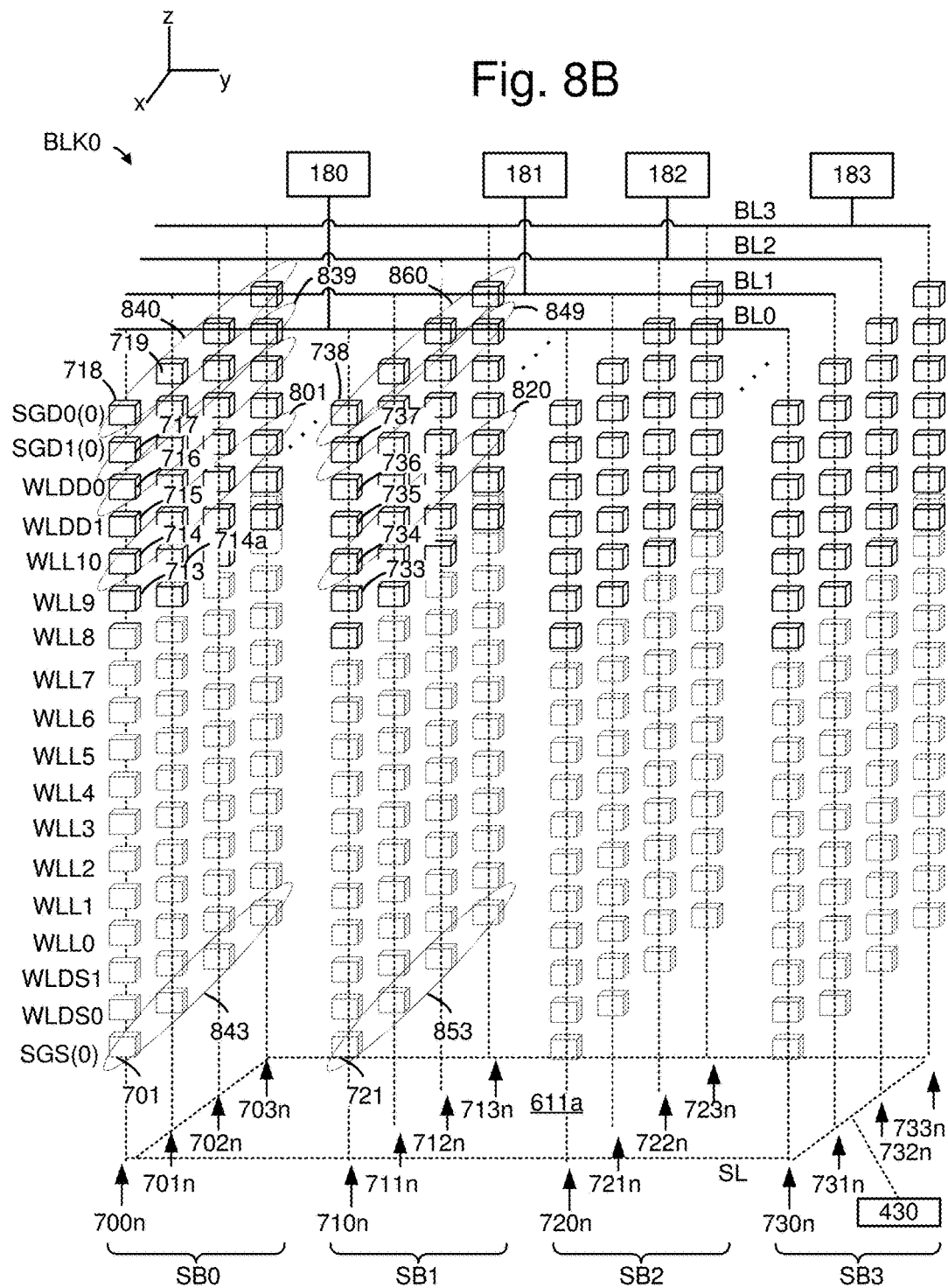

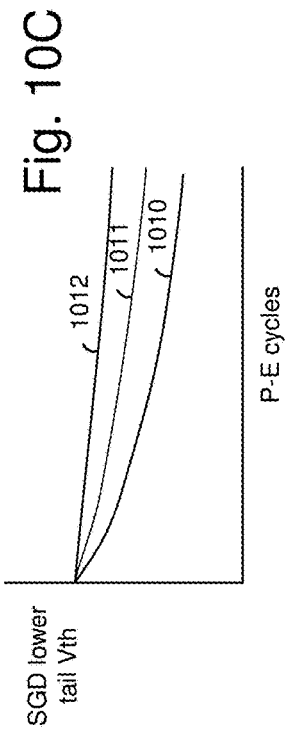
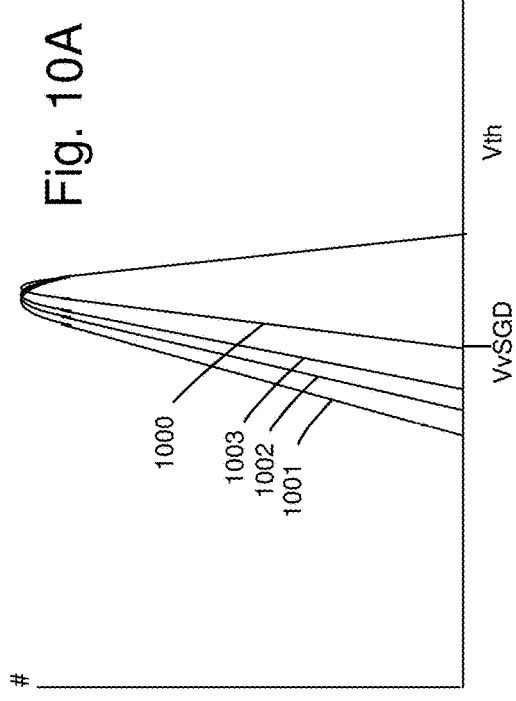
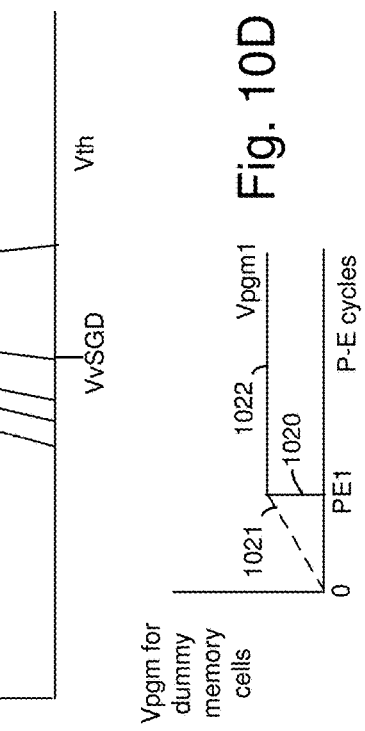
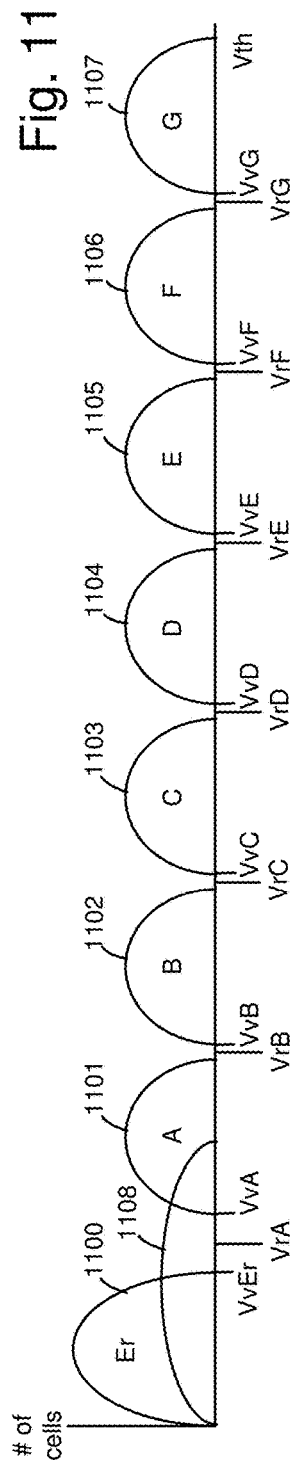

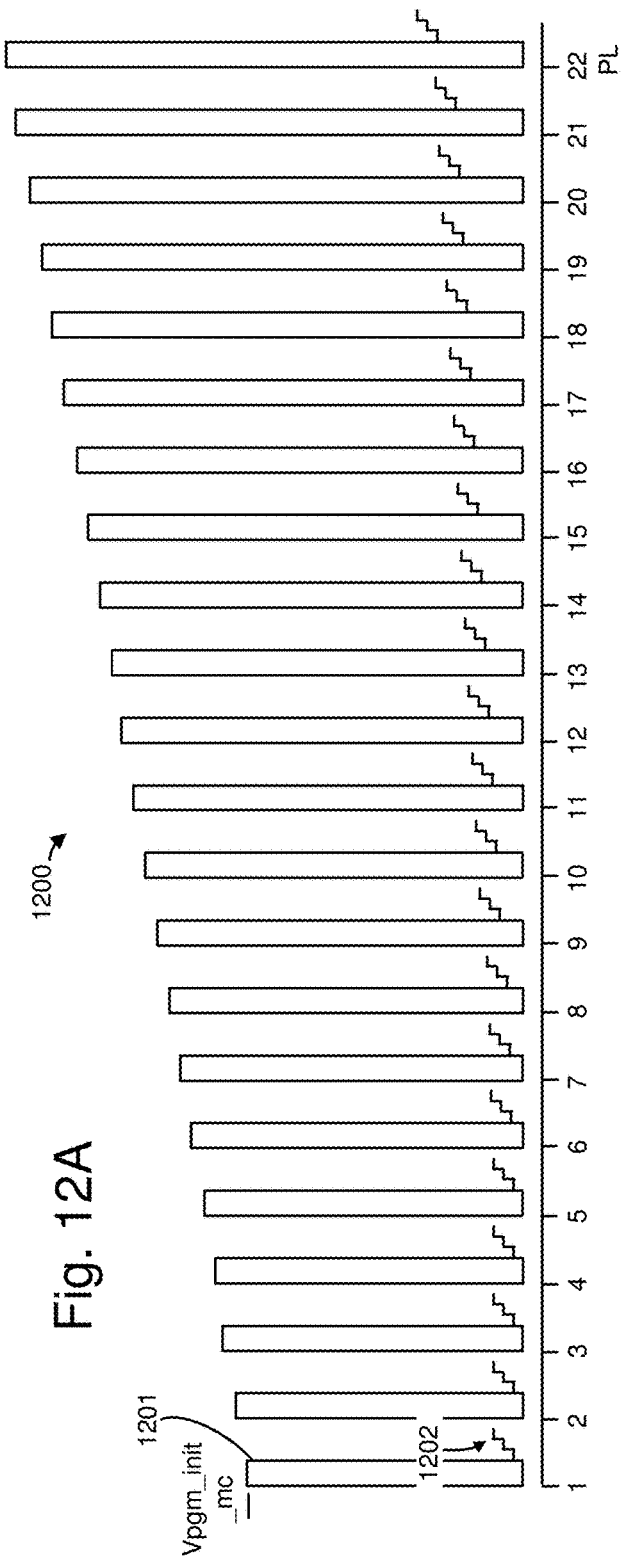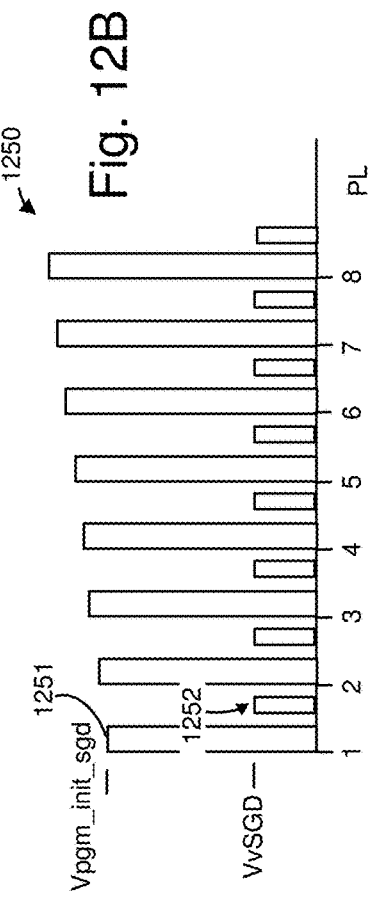

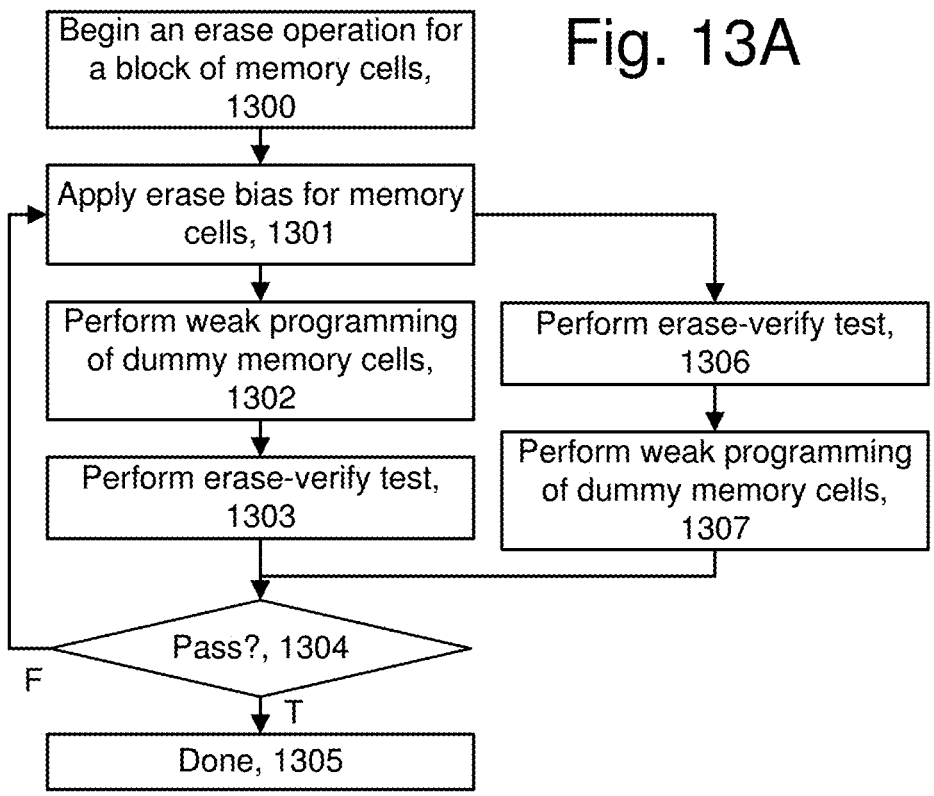

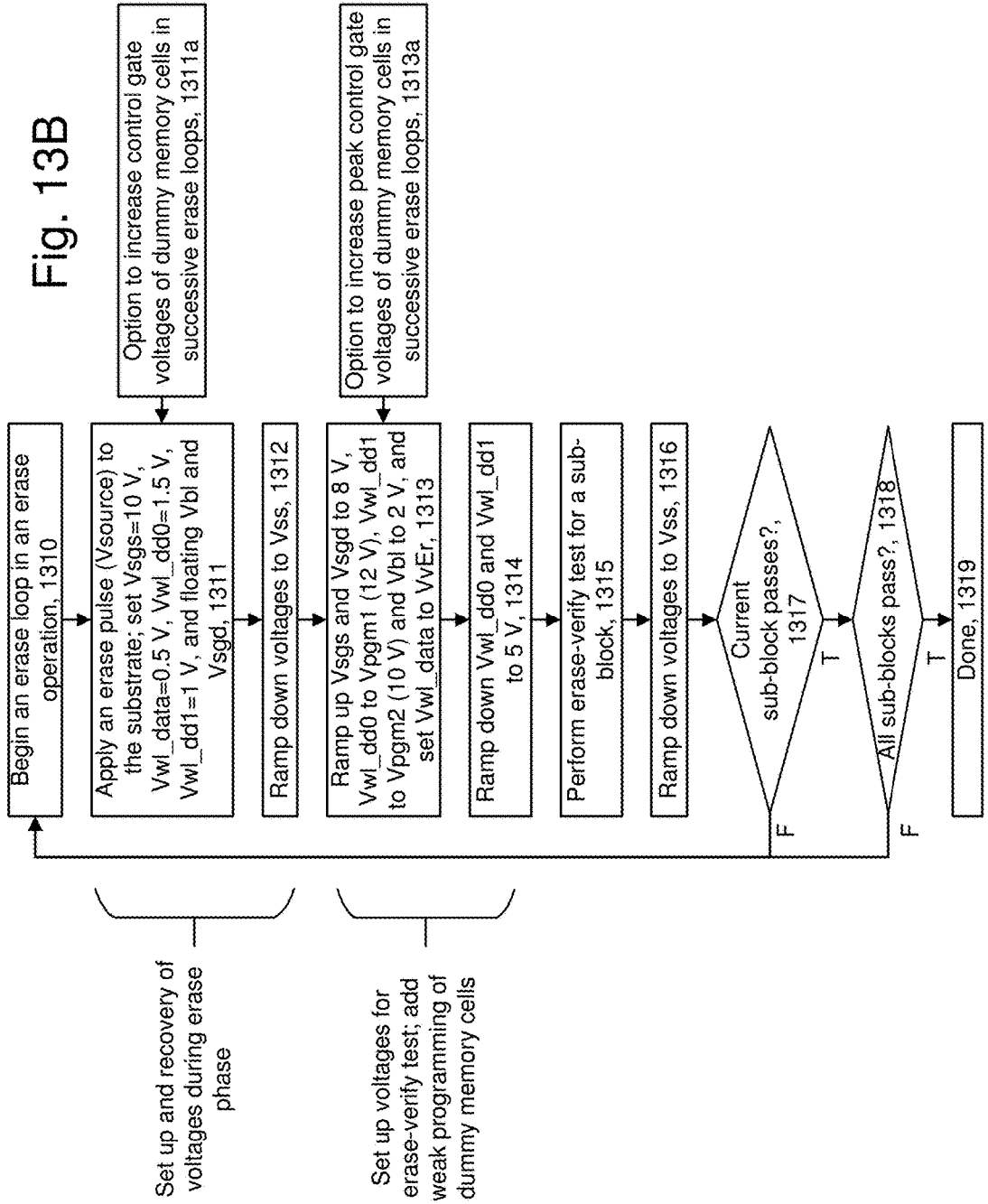

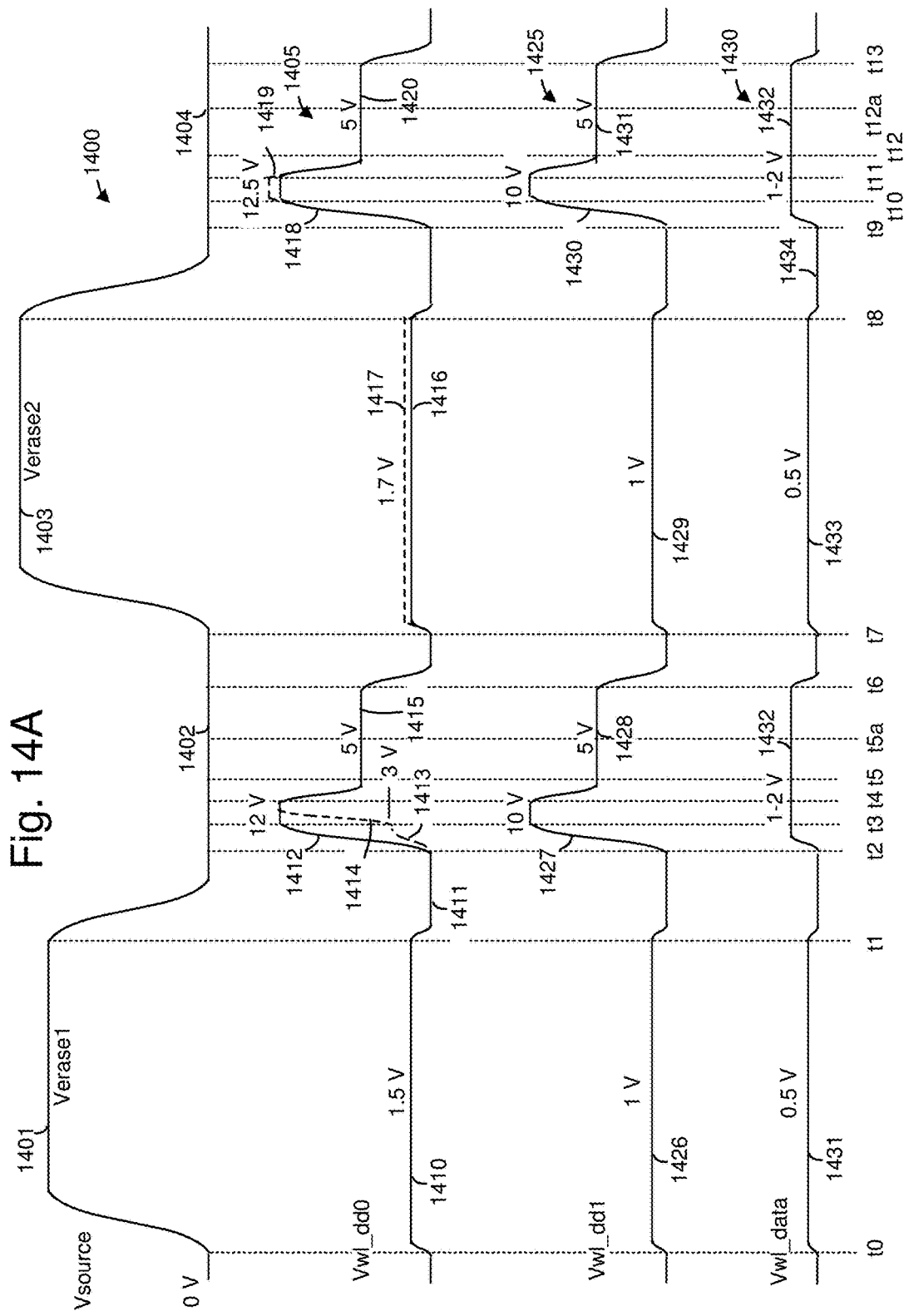

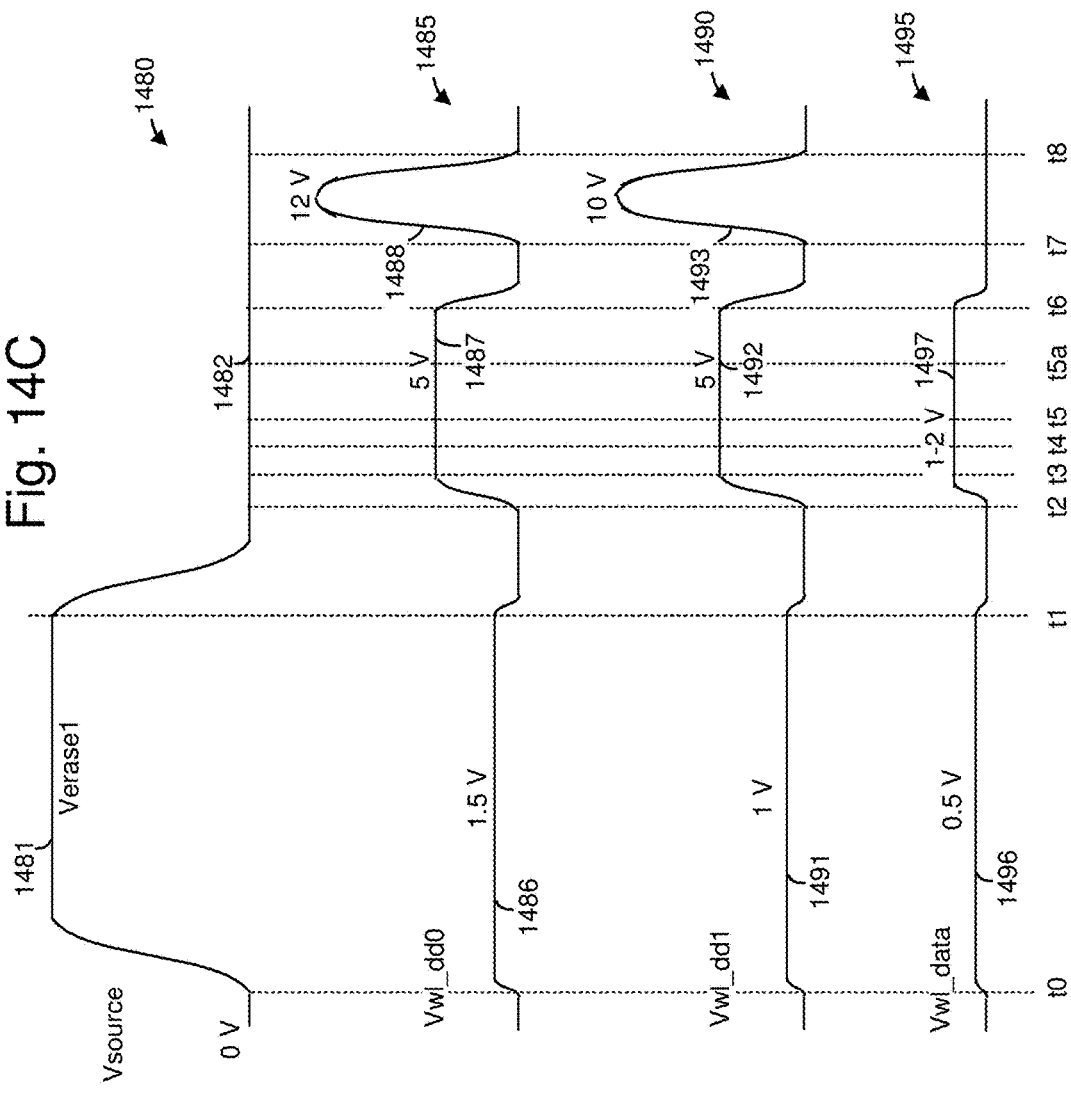

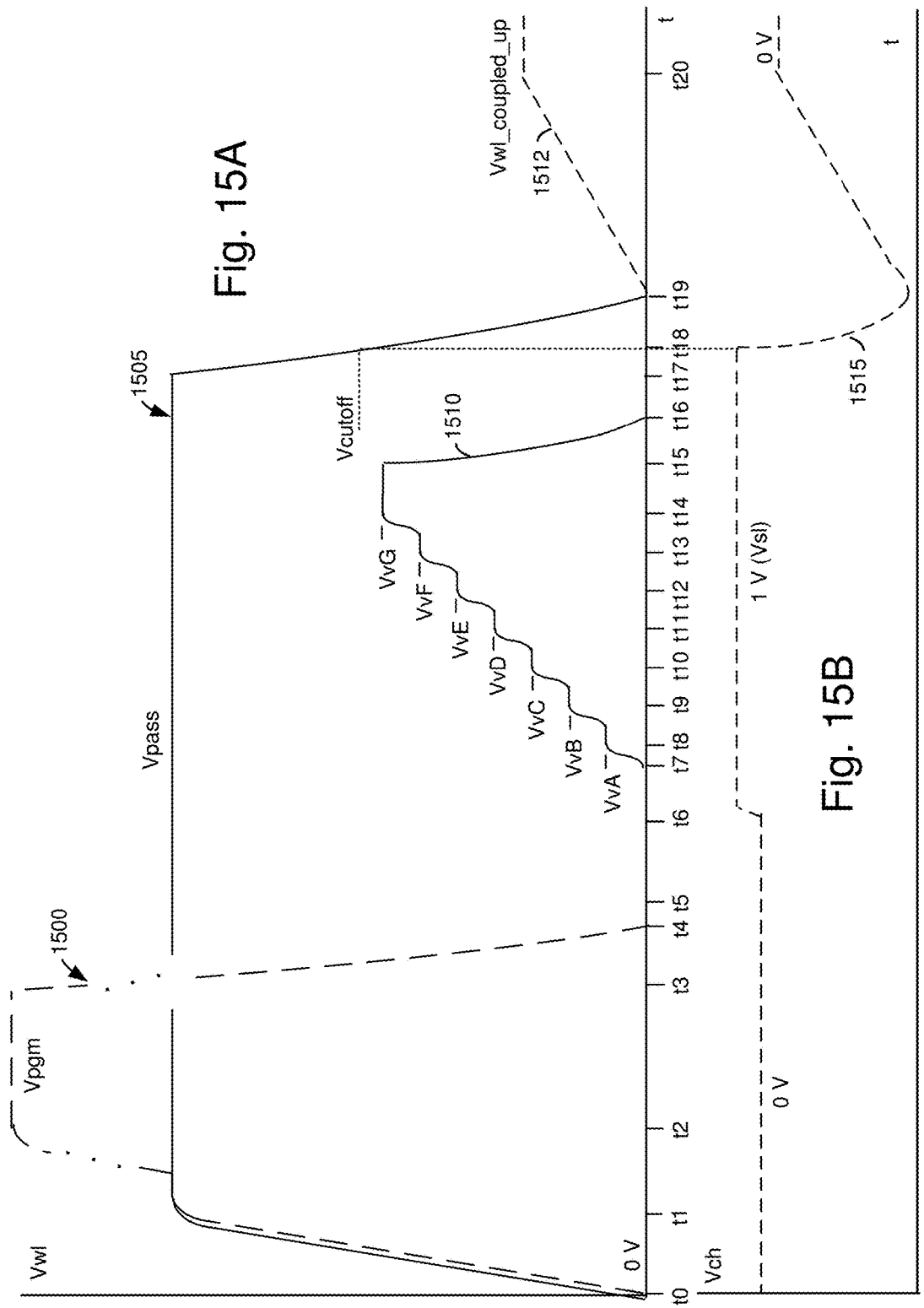

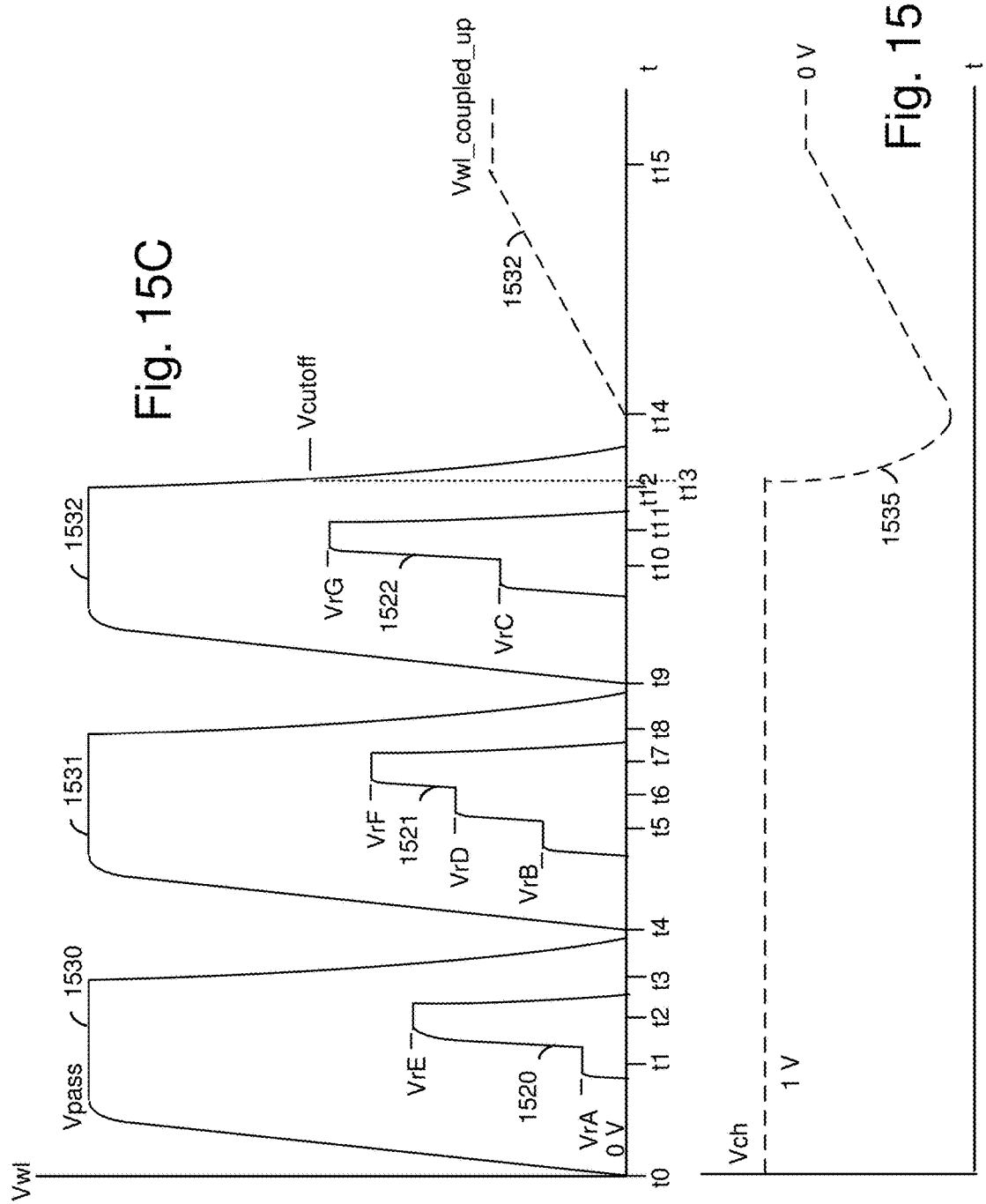

PROGRAMMING DUMMY MEMORY CELLS IN ERASE OPERATION TO REDUCE THRESHOLD VOLTAGE DOWNSHIFT FOR SELECT GATE TRANSISTORS

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND chains (e.g., NAND strings), for instance, where select gate transistors are provided at the ends of the NAND chain to selectively connect a channel of the NAND chain to a source line or bit line. However, various challenges are presented in operating such memory devices.

BRIEF DESCRIPTION OF THE DRAWINGS

FIG. 6A depicts an example cross-sectional view of a portion of the block BLK0 of FIG. 5.

FIG. 6B depicts an example transistor 650.

FIG. 7 depicts an example view of NAND chains in a block BLK0 which is consistent with FIGS. 5 and 6A.

FIG. 8A depicts control gate layers in the block BLK0 consistent with FIG. 7.

FIG. 8B depicts additional detail of the block BLK0 of FIG. 7.

FIG. 10A depicts a threshold voltage distribution of select gate transistors for a fresh memory device (plot 1000), for a cycled memory device with no programming of the dummy memory cells (plot 1001), for a cycled memory device with programming of the dummy memory cells after the erase-verify test (plot 1002), and for a cycled memory device with programming of the dummy memory cells before the erase-verify test (plot 1003) and after the erase pulse.

FIG. 10B depicts a plot of fail bit count versus the voltage of the lower tail of the Vth distribution of FIG. 10A, showing how the fail bit count increases as the Vth is downshifted.

FIG. 10C depicts a plot of an SGD lower tail Vth versus a number of program-erase cycles for the case of no programming of the dummy memory cells (plot 1010), programming of the dummy memory cells with a lower program voltage (plot 1011), and programming of the dummy memory cells with a higher program voltage (plot 1012).

FIG. 10D depicts a plot of a program voltage (Vpgm) for dummy memory cells as a function of a number of program-erase cycles.

FIG. 11 depicts an example Vth distribution of a set of memory cells after a program operation, where eight data states are used, and where program disturb is caused for the erase state memory cells due to a downshift in the Vth of a select gate transistor.

FIG. 12A depicts a voltage signal used in a series of program loops in an example program operation of a data memory cell which results in the Vth distribution of FIG. 11.

FIG. 12B depicts a voltage signal used in a series of program loops in an example program operation of a select gate transistor.

FIG. 13A depicts a process for erasing memory cells while weakly programming dummy memory cells to reduce a downshift in the Vth of the select gate transistors.

FIG. 13B depicts an example implementation of the process of FIG. 13A.

FIG. 14A depicts plots of example voltage signals used in an erase operation consistent with FIGS. 13A and 13B, where weak programming of the dummy memory cells occurs before the erase-verify test.

FIG. 14C depicts plots of example voltage signals used in an erase operation consistent with FIG. 13A, where weak programming of the dummy memory cells occurs after the erase-verify test.

FIG. 15A depicts a plot of example waveforms in a programming operation, showing coupling up of a word line voltage, where the coupled up word line voltage can cause the hole migration of FIG. 9B.

FIG. 15B depicts a plot of a channel voltage (Vch) corresponding to FIG. 15A.

FIG. 15C depicts a plot of example waveforms in a read operation, showing coupling up of a word line voltage, where the coupled up word line voltage can cause the hole migration of FIG. 9B.

FIG. 15D depicts a plot of a channel voltage (Vch) corresponding to FIG. 15C.

DETAILED DESCRIPTION

Figure 1A:
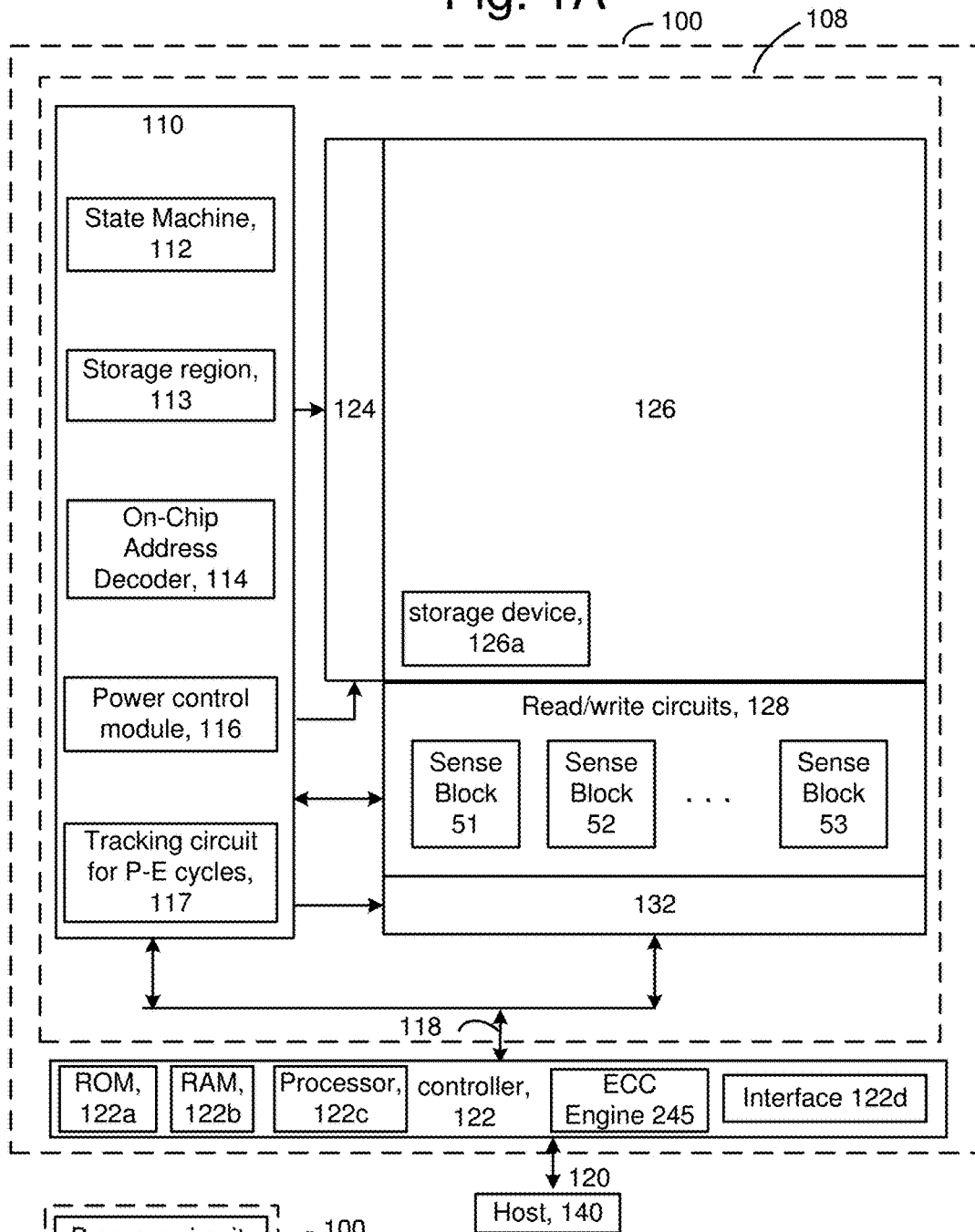
FIG. 1A is a block diagram of an example memory device.

Apparatuses and techniques are described for reducing charge loss in a select gate transistor in a memory device.

In some memory devices, memory cells are joined to one another such as in NAND chains in a block or sub-block. Each NAND chain comprises a number of memory cells connected in series between one or more drain-end select gate transistors (referred to as SGD transistors), on a drain-end of the NAND chain which is connected to a bit line, and one or more source-end select gate transistors (referred to as SGS transistors), on a source-end of the NAND chain or other memory string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND chains in a stack, where the stack comprises alternating conductive and dielectric layers. The conductive layers act as word lines which are connected to the memory cells. Each NAND chain may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a NAND chain of memory cells to provide a gradual transition in the channel voltage gradient.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 14. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 11). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the Vth of the memory cell exceeds the read voltage. The read voltages are set at levels which are expected to be between the threshold voltage levels of adjacent data states. During the read operation, the voltages of the unselected word lines are ramped up to a read pass level which is high enough to place the unselected memory cells in a strongly conductive state, to avoid interfering with the sensing of the selected memory cells.

To ensure proper program, erase and read operations in a NAND chain, the Vth of the SGD transistor should be in a specified range. However, it has been observed that the Vth can decrease over time, such as shown in FIG. 10A. Specifically, when a charge-trapping region 700ct1 extends in the NAND chain between the SGD transistor 717 and the adjacent dummy memory cell 716, holes can move from the dummy memory cell to the SGD transistor and combine with electrons in the SGD transistor, reducing the Vth. See FIG. 9B and the arrow 920 showing this movement of holes. Uncorrectable errors can result when the Vth of the select gate transistors is not in a specified range.

Techniques provided herein address the above and other issues. In one aspect, the dummy memory cell is weakly programmed during an erase operation. This weak programming is less than the amount of programming of a data memory cell as measured in terms of an increase in Vth, for example. A program pulse can be applied to a dummy memory cell which is adjacent to a select gate transistor in a set of connected transistors such as a NAND chain. The program pulse can be applied after an erase bias is applied to the memory cells and before an erase-verify test is performed, in one approach. The erase bias can include a substrate voltage Vsource. The program pulse can be a relatively brief pulse which is applied during the setup of the voltages for the erase-verify test so that there is little or no time penalty. The magnitude of the program pulse can be increased in successive erase loops of an erase operation as the magnitude of the substrate voltage is also increased. The magnitude of the program pulse can also be set as an increasing function of a number of program-erase (P-E) cycles. The erase bias of the dummy memory cells can be made smaller than the erase bias of the data memory cells, and can change in successive erase loops of the erase operation.

These and other features are discussed further below.

FIG. 1A is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 116 (power control circuit) and a tracking circuit for P-E cycles 117. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 4. The sense blocks can include bit line drivers, in one approach. The tracking circuit for P-E cycles 117 can store data identifying a number of program-erase cycles which have been performed in each block. The tracking circuit can comprise a counter, for example. The number of P-E cycles can be used to decide whether to perform weak programming for dummy memory cells or to set the magnitude for a programming pulse for dummy memory cells. See, e.g., FIGS. 10C and 10D.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND chain is an example of a set of series-connected transistors comprising memory cells and SG transistors.

A NAND memory array may be configured so that the array is composed of multiple strings of memory in which a NAND chain is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND chain within a single horizontal (e.g., x-y) memory device level. Alternatively, the memory elements may be coupled together to form a vertical NAND chain that traverses across multiple horizontal memory device levels. Other 3D configurations can be envisioned wherein some NAND chains contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
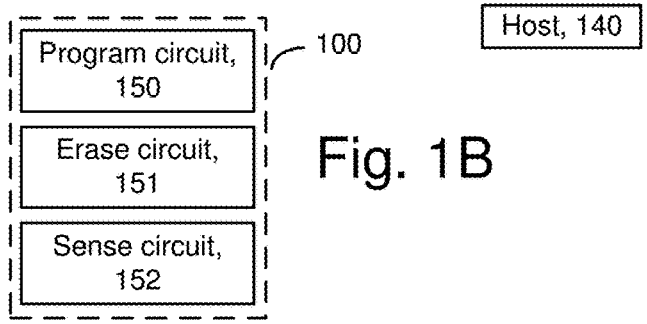
FIG. 1B depicts an example configuration of circuits in the memory device of FIG. 1A.

FIG. 1B depicts an example configuration of circuits in the memory device 100 of FIG. 1A. The memory device can include a program circuit 150, an erase circuit 151 and a sense circuit 152. The program circuit may provide programming of data memory cells as well as weak programming of dummy memory cells as described herein. The program circuit can include, e.g., the control circuitry 110, including the power control module 116 for applying voltages such as described in connection with FIG. 14A-14C, the tracking circuit for P-E cycles 117 for deciding when to perform the weak programming, and determining a magnitude of the weak program pulse, and the controller 122 for providing control signals to the control circuitry.

The erase circuit may provide erasing of data memory cells and dummy memory cells as described herein. The erase circuit can include, e.g., the control circuitry 110, including the power control module 116 for applying voltages such as described in connection with FIG. 14A-14C, and the controller 122 for providing control signals to the control circuitry.

The sense circuit may provide sensing of data memory cells and/or dummy memory cells as described herein. The sense circuit can include, e.g., the sense blocks 51-53, the control circuitry 110, including the power control module 116 for applying voltages such as described in connection with FIG. 14A-14C, and the controller 122 for providing control signals to the control circuitry.

The program circuit, erase circuit and sense circuit may include hardware, software and/or firmware for performing the weak programming processes for dummy memory cells as described herein, such as in connection with FIGS. 13A and 13B.

Figure 2:
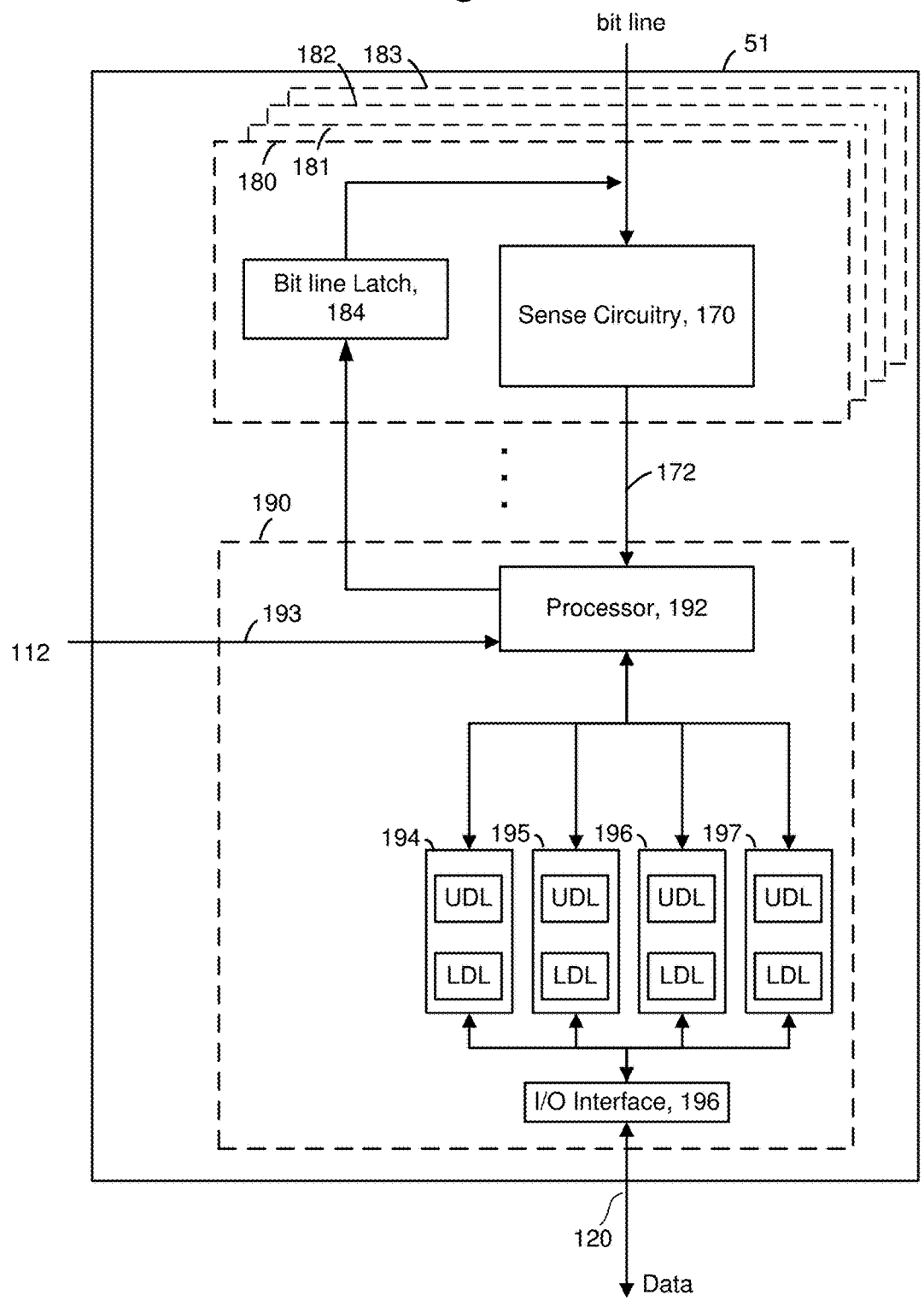
FIG. 2 is a block diagram depicting one embodiment of the sense block 51 of FIG. 1A.

FIG. 2 is a block diagram depicting one embodiment of the sense block 51 of FIG. 1. An individual sense block 51 is partitioned into one or more core portions, referred to as sense circuits 180-183 or sense amplifiers, and a common portion, referred to as a managing circuit 190. In one embodiment, there will be a separate sense circuit for each bit line/NAND chain and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements.

The sense circuit 180, as an example, comprises sense circuitry 170 that performs sensing by determining whether a conduction current in a connected bit line is above or below a predetermined threshold level. Sense circuit 180 also includes a bit line latch 184 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 190 comprises a processor 192, four example sets of data latches 194-197 and an I/O Interface 196 coupled between the set of data latches 194 and data bus 120. One set of data latches, e.g., LDL and UDL, can be provided for each sense circuit. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

The processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense circuit 180 may trip at one of these voltages and a corresponding output will be provided from sense circuit 180 to processor 192 via bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197. In another embodiment of the managing circuit 190, bit line latch serves double duty, both as a latch for latching the output of the sense circuit 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL and UDL latches, in a two-bit per storage element implementation. In a three-bit per storage element implementation, an additional data latch may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 192 monitors the read back memory state relative to the desired memory state. When the two are in agreement, the processor 192 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuitry sets it to an inhibit value during the verify process.

Each set of data latches 194-197 may be implemented as a stack of data latches for each sense circuit. In one embodiment, there are three data latches per sense circuit 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
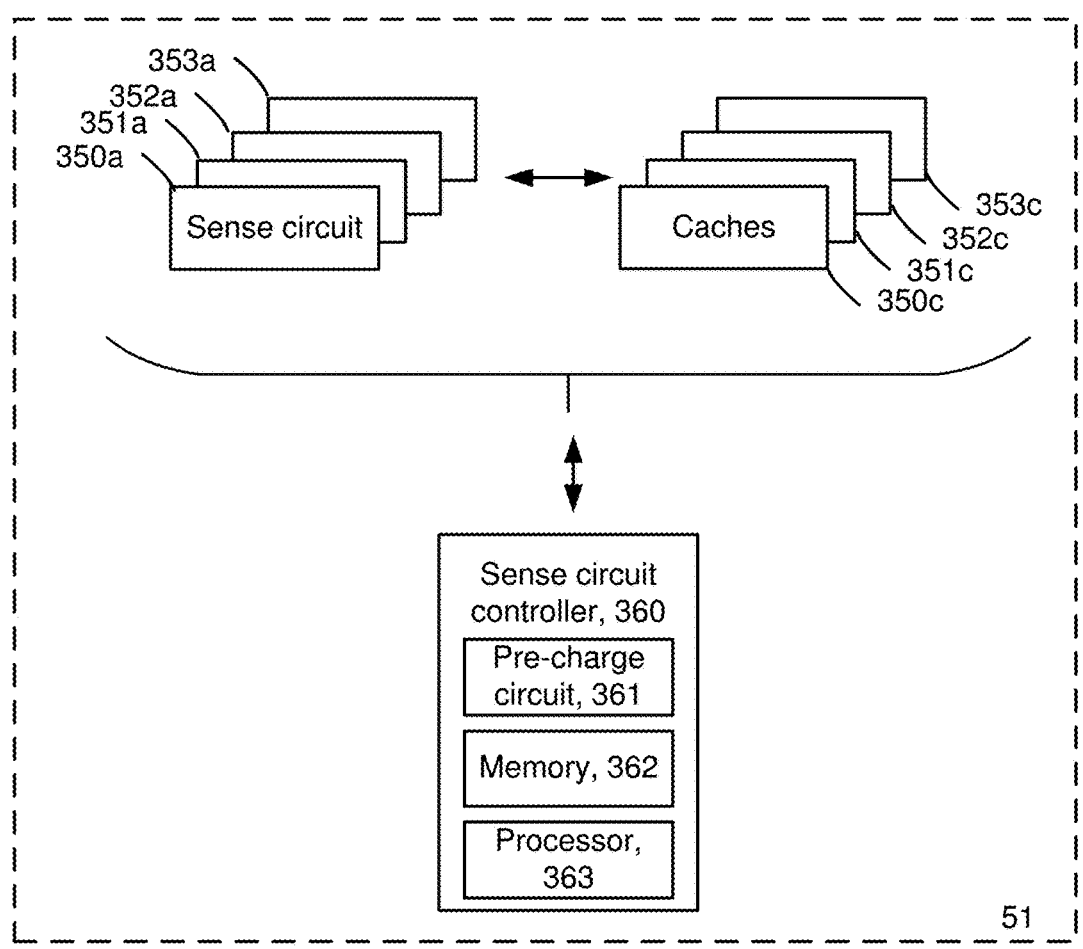
FIG. 3 depicts another example block diagram of the sense block 51 of FIG. 1.

FIG. 3 depicts another example block diagram of the sense block 51 of FIG. 1. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
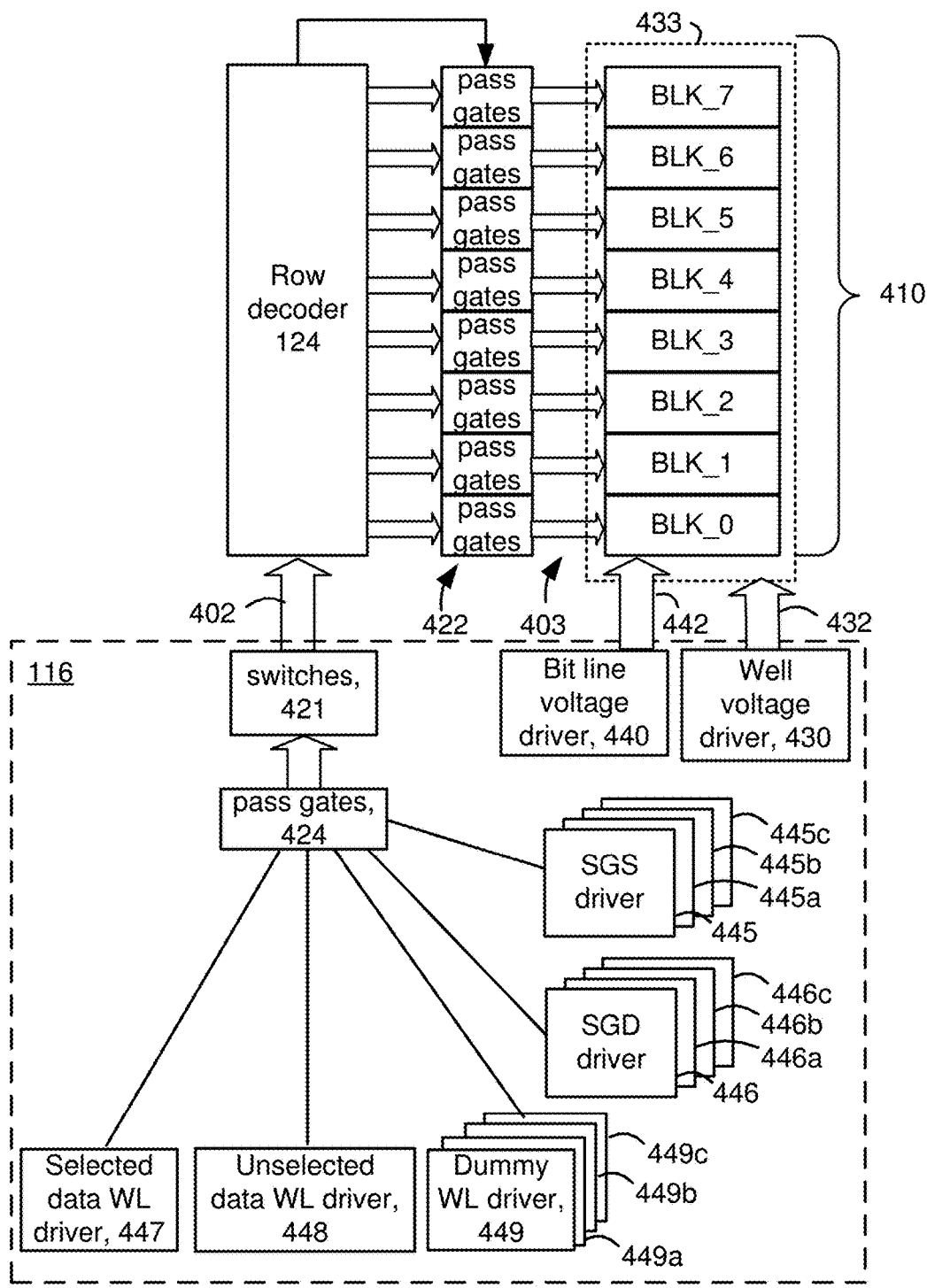
FIG. 4 depicts an example implementation of the power control module 116 of FIG. 1A for providing voltages to blocks of memory cells.

FIG. 4 depicts an example implementation of the power control module 116 of FIG. 1A for providing voltages to blocks of memory cells. In this example, the memory structure 126 includes a set 410 of eight blocks, BLK_0 to BLK_7, which could be in a plane. The row decoder 124 of FIG. 1A provides voltages to word lines and select gates of each block. The row decoder provides a control signal to pass gates 422 which connect the blocks to the row decoder. Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 421 which connect to the global control lines. Pass gates 424, also referred to as pass transistors or transfer transistors, are controlled to pass voltages from the voltage drivers to the switches 421.

The voltage drivers can include a selected word line (WL) driver 447, which provides a voltage on a word line selected during a program or read operation, a driver 448 for unselected data word lines, and dummy word line drivers 449-449c which provide voltages on dummy word lines. For example, the dummy word line drivers 449, 449a, 449b and 449c may provide voltages on the control gate layers WLDD0, WLDD1, WLDS1 and WLDS0, respectively, in FIG. 6A, during an erase operation as described herein.

The voltage drivers can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7, 8A and 8B. In another option, one SGS driver is common to the different sub-blocks in a block.

The various components, including the row decoder, may receive commands from a controller such as the state machine 112 or the controller 122 to perform the functions described herein.

The well voltage driver 430 provides a voltage Vsource to the well region 611a (see FIGS. 6A and 8B) in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 5 to 8B, sets of connected memory cells may be arranged in NAND chains which extend vertically upward from the substrate. The bottom (or source end) of each NAND chain is in contact with the well region, and the top end (or drain end) of each NAND chain is connected to a respective bit line, in one approach.

Figure 5:
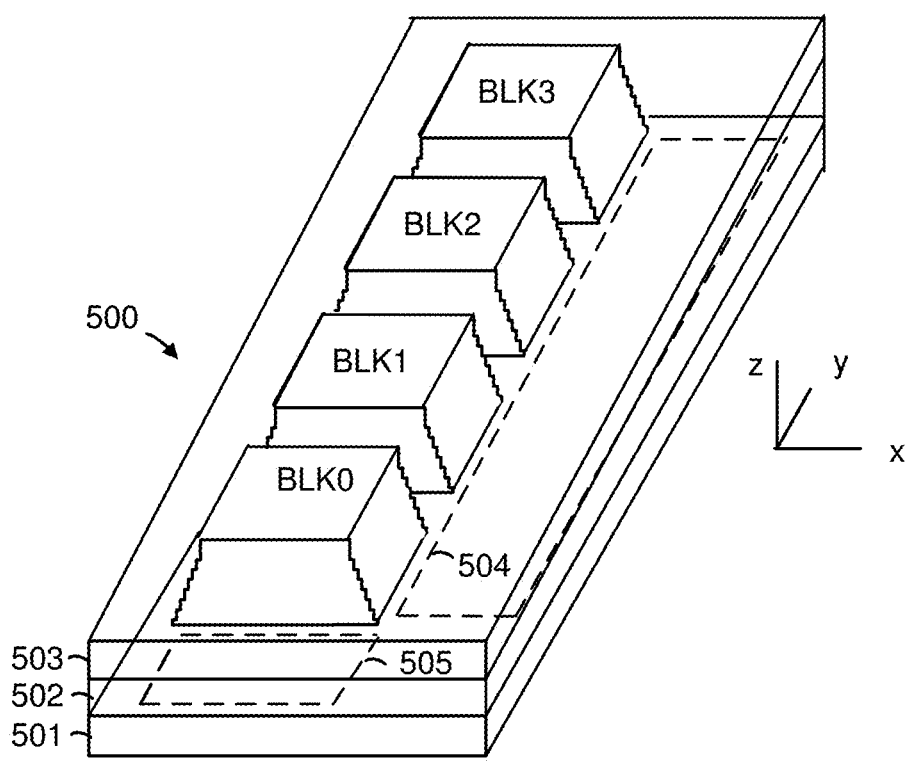
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass gates for a voltage driver of the SGS transistors may be located in this peripheral area 505, in one approach. In this case, the blocks BLK0, BLK1, BLK2 and BLK3 are at progressively further distances from the pass gates. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 6C:
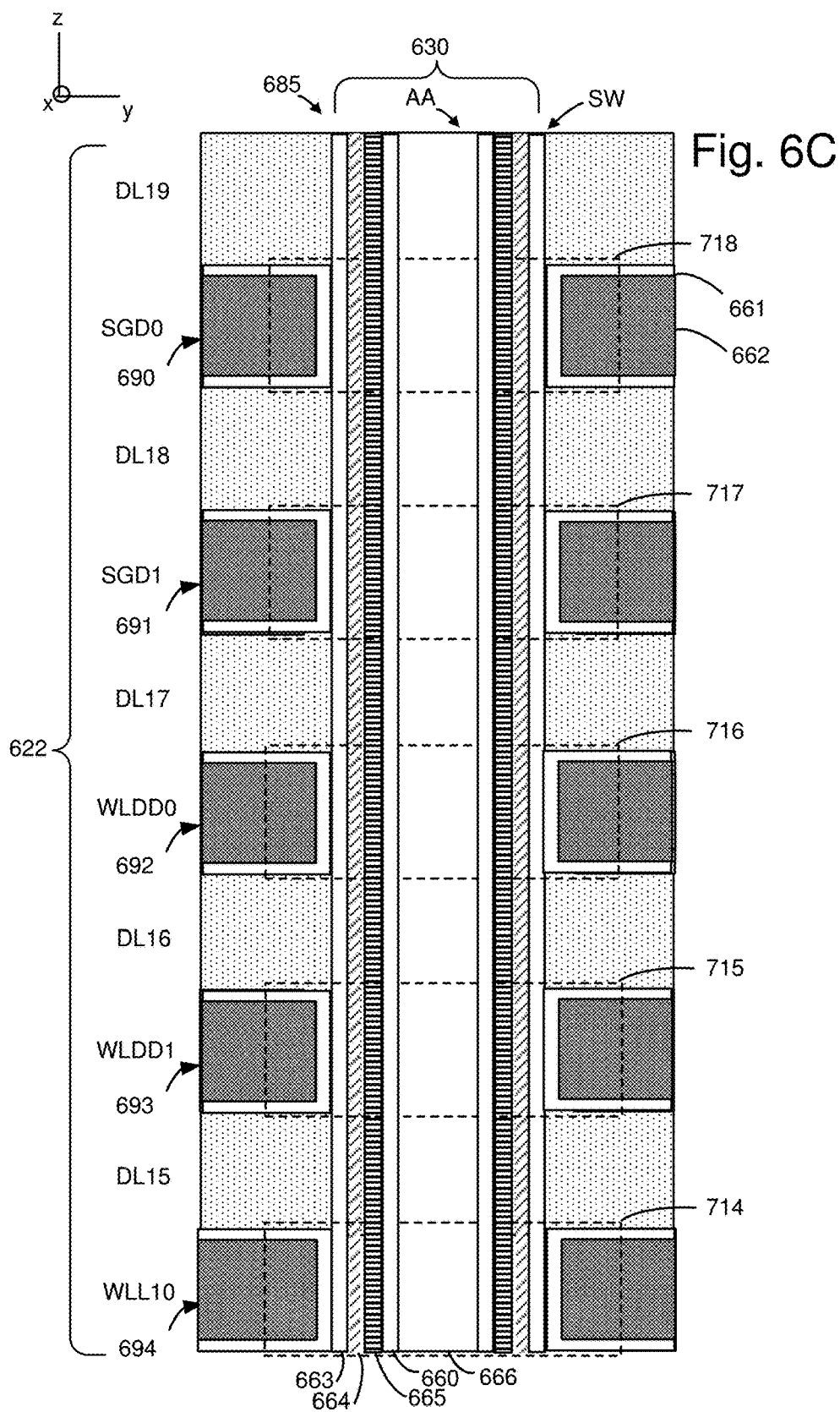
FIG. 6C depicts a close-up view of the region 622 of the stack of FIG. 6A.

FIG. 6A depicts an example cross-sectional view of a portion of the block BLK0 of FIG. 5. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND chains 700n and 710n are depicted. Each NAND chain encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises a well region 611a as an n-type source diffusion layer or well in the substrate. The well region is in contact with a source end of each string of memory cells in a block. An erase pulse may be applied to this layer in an erase operation The n-type well region 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts an example transistor 650. The transistor comprises a control gate CG, a drain D, a source S and a channel CH and may represent a memory cell or a select gate transistor, for example.

FIG. 6C depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. These SGD transistors are at the drain end of the NAND chain. The problem of Vth downshift as mentioned at the outset occurs mainly with the SGD transistor 717 which is adjacent to the dummy memory cell 716. By reducing the accumulation of holes in the dummy memory cell 716 using weak programming as described herein, the Vth downshift of the SGD transistor 717 can be reduced. The other drain-side dummy memory cell 715 could have a secondary effect on the SGD transistor 717. One approach involves also programming the dummy memory cell 715 with the dummy memory cell 716. The programming of the dummy memory cell 715 can be weaker than the programming of the dummy memory cell 716.

The problem of Vth downshift can also occur with the SGS transistor 701 which is adjacent to the dummy memory cell 702 in FIG. 7. By reducing the accumulation of holes in the dummy memory cell 702 using weak programming as described herein, the Vth downshift of the SGS transistor 701 can be reduced. The other source-side dummy memory cell 703 could have a secondary effect on the SGS transistor 701. One approach involves also programming the dummy memory cell 703 with the dummy memory cell 702. The programming of the dummy memory cell 703 can be weaker than the programming of the dummy memory cell 702.

A number of layers can be deposited along the sidewall (SW) of the memory hole 630 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665, a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND chain.

Each NAND chain or set of connected transistors comprises a channel which extends continuously from one or more source-end select gate transistors to one or more drain-end select gate transistors. For example, the channels 700a, 710a, 720a and 730a extend continuously in the NAND chains 700n, 710n, 720n and 730n, respectively. The channel 700a extends continuously in the NAND chains 700n from the SGS transistor 701 to the SGD transistors 717 and 718. The channel 700a is continuous in that it is uninterrupted and can therefore provide a continuous conductive path in the NAND chain.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND chain can be considered to have a floating body channel because the length of the channel is not formed on a substrate. Further, the NAND chain is provided by a plurality of word line layers above one another in a stack, and separated from one another by dielectric layers.

FIG. 7 depicts an example view of NAND chains in the block BLK0 which is consistent with FIGS. 5 and 6A. The NAND chains are arranged in sub-blocks of the block in a 3D configuration. Each sub-block includes multiple NAND chains, where one example NAND chain is depicted. For example, SB0, SB1, SB2 and SB3 comprise example NAND chains 700n, 710n, 720n and 730n, respectively. The NAND chains have data word lines, dummy word lines and select gate lines consistent with FIG. 6A. Each sub-block comprises a set of NAND chains which extend in the x direction and which have a common SGD line or control gate layer. The NAND chains 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line and end at WLL10, the drain-end word line, for example.

The NAND chains 700n, 710n, 720n and 730n have channels 700a, 710a, 720a and 730a, respectively.

Additionally, NAND chain 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND chain 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND chain 720n includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND chain 730n includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each NAND chain, and one or more SGS transistors are provided at the source-end of each NAND chain. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by separate control lines SGS(0), SGS(1), SGS(2) and SGS(3), respectively. In another approach, all of the SGS transistors in a block are connected and commonly driven.

FIG. 8A depicts control gate layers in the block BLK0 consistent with FIG. 7. The control gate layers are arranged in a stack 800 and include dummy word lines layers or control gate layers WLDS0, WLDS1, WLDD0 and WLDD1, and data word line layers or control gate layers WLL0-WLL10, which are shared among the different sub-blocks SB0-SB3. The control gate layers include a separate SGS control gate layer for each sub-block, e.g., SGS(0)-SGS(3) and separate SGD control gate layers for each sub-block. For example, SB0 includes SGD0(0) and SGD1 (0), SB1 includes SGD0(1) and SGD1(1), SB2 includes SGD0(2) and SGD1(2), and SB3 includes SGD0(3) and SGD1(3). Additionally, four example memory holes are depicted in each sub-block. SGD transistors 718, 718a, 718b and 718c are depicted in SGD0(0), SGD transistor 717 is depicted in SGD1(0) and dummy memory cell 716 is depicted in WLDD0.

FIG. 8B depicts additional detail of the block BLK0 of FIG. 7. Example memory cells are depicted which extend in the x direction along word lines in each sub-block. Each memory cell is depicted as a cube for simplicity. SB0 includes NAND chains 700n, 701n, 702n and 703n. SB1 includes NAND chains 710n, 711n, 712n and 713n. SB2 includes NAND chains 720n, 721n, 722n and 723n. SB3 includes NAND chains 730n, 731n, 732n and 733n. Bit lines are connected to sets of NAND chains. For example, a bit line BL0 is connected to NAND chains 700n, 710n, 720n and 730n, a bit line BL1 is connected to NAND chains 701n, 711n, 721n and 731n, a bit line BL2 is connected to NAND chains 702n, 712n, 722n and 732n, and a bit line BL3 is connected to NAND chains 703n, 713n, 723n and 733n. Sense circuits may be connected to each bit line. For example, sense circuits 180, 181, 182 and 183 of FIG. 2 are connected to bit lines BL0, BL1, BL2 and BL3.

Programming and reading can occur for selected cells in one word line and one sub-block at a time. This allows each selected cell to be controlled by a respective bit line and/or source line. For example, a set of memory cells 801, which includes an example memory cell 714, is connected to WLL10 in SB0. This is the drain-end data word line. WLL0 is the source-end data word line. A set of memory cells may be programmed or read concurrently. An additional set of memory cells is connected to WLL10 in each of the other sub-blocks SB1-SB3. For example, a set of memory cells 820, which includes an example memory cell 734, is connected to WLL10 in SB1.

In this example, the source line SL or source region is driven at a voltage Vsource by the well voltage driver 430.

Each NAND chain includes one or more SGD transistors at the drain-end and one or more SGS transistors at the source end. In this case, there are two SGD transistors and one SGS transistor per string. Each SGD transistor may be connected to separate control line layer, as in FIG. 8A, so that it can be driven separately, or the two or more SGD transistors in a NAND chain may have their control gates connected and commonly driven. For example, SB0 has sets of SGD transistors 840 and 839, with example SGD transistors 718 and 717, respectively, in the NAND chain 700n. The set of SGD transistors 840 also includes an example SGD transistor 719 in the NAND chain 701n. SB0 also has a set of SGS transistors 843, with an example SGS transistor 701 in the NAND chain 700n. Similarly, SB1 has sets of SGD transistors 860 and 849, with example SGD transistors 738 and 737, respectively, in the NAND chain 710n. SB1 also has a set of SGS transistors 853, with an example SGS transistor 721 in the NAND chain 710n.

The NAND chain 700n includes SGD transistors 718 and 717 connected to select gate control lines SGD0(0) and SGD1(0), respectively, dummy memory cells 716 and 715 connected to WLDD0 and WLDD1, respectively, and data memory cells 714 and 713 connected to WLL10 and WLL9, respectively. The NAND chain 710n includes SGD transistors 738 and 737 connected to select gate control lines SGD0(1) and SGD1(1) (see FIG. 7), respectively, dummy memory cells 736 and 735 connected to WLDD0 and WLDD1, respectively, and data memory cells 734 and 733 connected to WLL10 and WLL9, respectively.

Figure 9A:
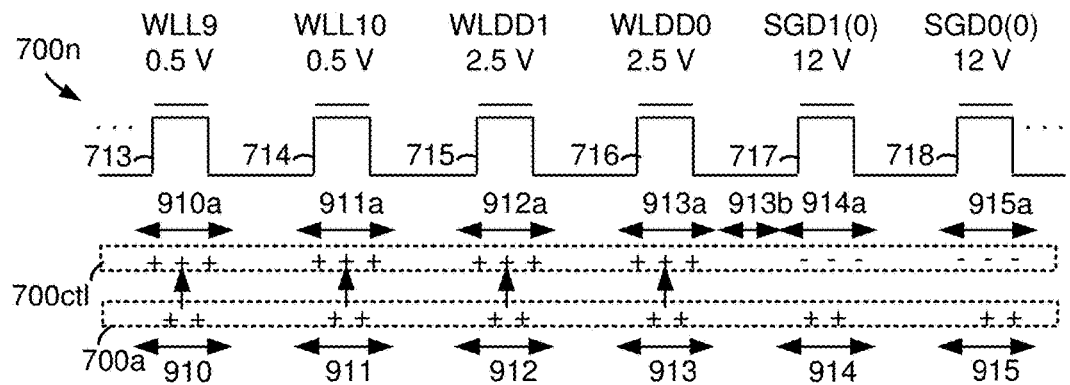
FIG. 9A depicts a plot of a portion of the NAND chain 700n of FIGS. 7 and 8B during an erase operation, showing how holes (+) are collected in a portion 913a of a charge-trapping layer 700ct1 within a dummy memory cell 716 while electrons are stored in a portion 914a of the charge-trapping layer within a select gate transistor 717.

FIG. 9A depicts a plot of a portion of the NAND chain 700n of FIGS. 7 and 8B during an erase operation, showing how holes (+) are collected in a portion 913a of a charge-trapping layer 700ct1 within a dummy memory cell 716 while electrons are stored in a portion 914a of the charge-trapping layer within a select gate transistor 717. The portions 913a and 914a are adjacent the WLDD0 and SGD1(0) control gate layers, respectively.

Figure 9B:
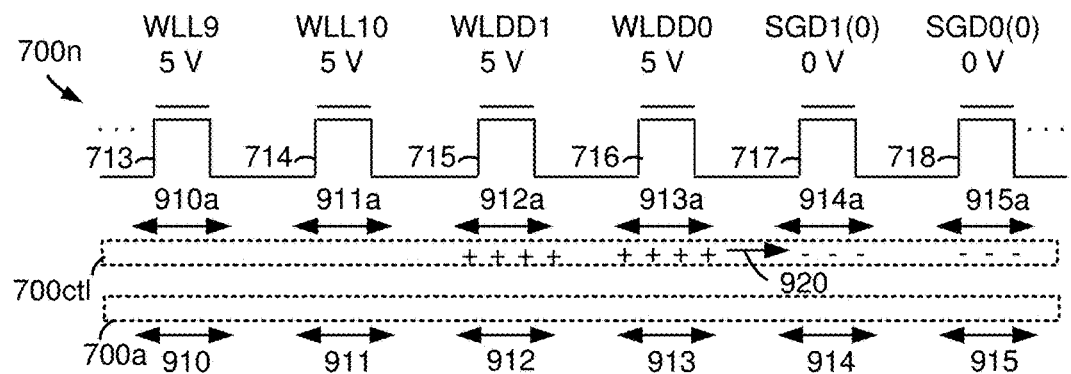
FIG. 9B depicts a plot of the portion of the NAND chain of FIG. 9A after read or programming, showing how holes (+) can migrate from the portion 913a to the portion 914a of the charge-trapping layer 700ct1, resulting in charge loss for the select gate transistor 717.
Figure 9C:
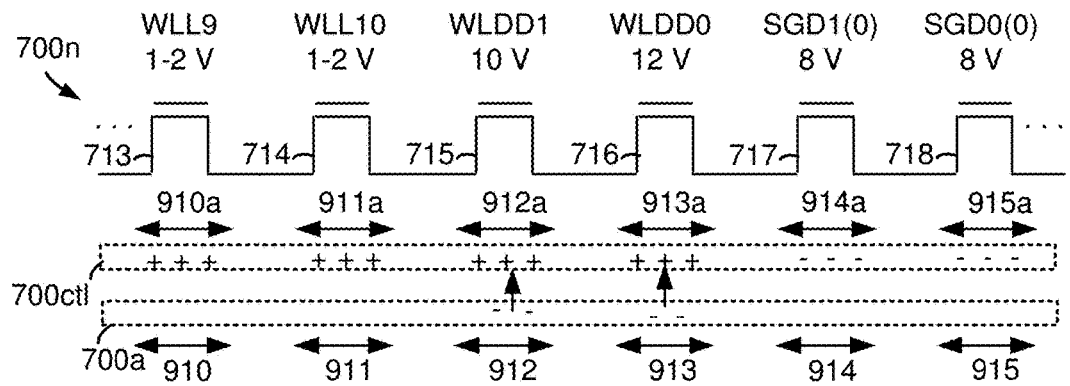
FIG. 9C depicts a plot of the portion of the NAND chain of FIG. 9A, showing weak programming of the dummy memory cells 715 and 716 after the erase operation of FIG. 9A, where electrons (−) move from the portions 912 and 913 of the channel 700a to the portions 912a and 913a, respectively, of the charge-trapping layer 700ct1, to recombine with the holes.

In FIG. 9A to 9C, a portion of the NAND chain 700n and its channel 700a and charge trapping layer 700ct1 are depicted. See also FIGS. 7 and 8B. The portion of the NAND chain shown is at the drain side of the NAND chain and includes the SGD transistors 718 and 717 connected to SGD0(0) and SGD1(0), respectively, the dummy memory cells 716 and 715 connected to WLDD0 and WLDD1, respectively, and the data memory cells 714 and 713 connected to WLL10 and WLL9, respectively. The remaining data memory cells and the SGS transistor extend to the left in the figure.

In the selected NAND chain 700n, the SGD transistors 718 and 717 include channel portions 915 and 914, respectively, and charge trapping layer portions 915a and 914a, respectively. The dummy memory cells 716 and 715 include channel portions 913 and 912, respectively, and charge trapping layer portions 913a and 912a, respectively. The data memory cells 714 and 713 include channel portions 911 and 910, respectively, and charge trapping layer portions 911a and 910a, respectively. Two drain-end dummy memory cells are provided as an example. In practice, one or more drain-end dummy memory cells can be provided in each NAND chain.

Each select gate transistor or memory cell has a threshold voltage (Vth) and a control gate or word line voltage. Typical values can include Vth=2 V for the SGD transistors and Vth=1 V for the dummy memory cells. The Vth of a data memory cell can vary based on whether the memory cell is programmed, and if it is programmed, based on its data state. The Vth of data memory cells may range from 0-5 V, for example. Generally, the programming of the memory cells is random so that a NAND chain will have cells in different states.

In the erase operation, in one approach, the voltages on SGD0(0) and SGD1(0) float at a level such as 12 V, the voltages on WLDD0 and WLDD1 are driven at Vwl_dd0 and Vwl_dd1, e.g., 1.5 V and 1 V, respectively, and the voltages on WLL10 and WLL9 are driven at Vwl_data, e.g., 0.5 V. See also FIG. 14A to 14C. The channel is charged up to a relatively high level such as 14 V so that the memory cells have a high channel-to-gate voltage and are erased. The dummy memory cells have a higher control gate voltage (and thus a lower channel-to-gate voltage) than the data memory cells so the dummy memory cells are slightly less deeply erased than the data memory cells. Moreover, the dummy memory cell 716 of WLDD0 may be slightly less deeply erased than the dummy memory cell 715 of WLDD1 since the dummy memory cell 716 has a higher control gate voltage and therefore a lower channel-to-gate voltage than the dummy memory cell 715.

The charged state of the channel is represented by the holes (+). Due to the high control gate voltage of the SGD transistors, the holes in the channel portions 914 and 915 are not drawn into the charge trapping layer portions 914a and 915a to erase these transistors. Moreover, the SGD transistors may be programmed to a Vth such as 2 V at the time of manufacture. This programed state is represented by the electrons (−) in the charge trapping layer portions 914a and 915a. Holes in the channel portions 910-913 tunnel from the channel into the charge trapping layer portions 910a-913a, respectively, and are stored there. Holes may also tunnel into a portions of the charge trapping layer which are between memory cells and the select gate transistors. For example, holes may tunnel into a portion 913b of the charge trapping layer which is between the dummy memory cell 716 and the SGD transistor 717. The holes will combine with any electrons in the charge trapping layer to erase these cells. The movement of the holes is represented by the vertical arrows.

To perform the erasing, an erase bias is provided for the data and dummy memory cells by the erase circuit 151.

FIG. 9B depicts a plot of the portion of the NAND chain of FIG. 9A after read or programming, showing how holes (+) can migrate from the portion 913a to the portion 914a of the charge-trapping layer 700ct1, resulting in charge loss for the select gate transistor 717. The control gate (word line) voltages for the dummy and data memory cells can be coupled up after a program or read operation is performed, as explained in connection with FIG. 15A to 15D. An example coupled up voltage of 5 V is depicted for the memory cells 716-713. With 5 V on the control gate on the dummy memory cell 716 and 0 V (a ground voltage) on the control gate of the adjacent SGD transistor 717, an electric field (where the voltage is higher on the dummy memory cell 716 than the SGD transistor 717) is created between these transistors which causes some of the holes which have been stored in the charge trapping layer portions 913a and 913b (and potentially even the charge trapping layer portion 912a) after the erase operation to move toward the electrons which have been stored in the charge trapping layer portion 914a of the SGD transistor 717. This movement is represented by a horizontal arrow and is due to the Poole-Frankel effect. The holes will combine with the electrons, resulting in a charge loss for the SGD transistor 717. The charge loss is seen as a Vth downshift, as depicted in FIG. 10A. Moreover, more holes will move as time passes and the electric field is present, making the downshift worse. This process is repeated when the memory cells are subsequently erased, programmed and read.

Note that the SGD transistor 718 which is not adjacent to the dummy memory cell 716 does not typically experience this charge loss.

FIG. 9C depicts a plot of the portion of the NAND chain of FIG. 9A, showing weak programming of the dummy memory cells 715 and 716 after the erase operation of FIG. 9A, where electrons (−) move from the portions 912 and 913 of the channel 700a to the portions 912a and 913a, respectively, of the charge-trapping layer 700ct1, to recombine with the holes. In this example, both of the drain-side dummy memory cells are weakly programmed. These dummy memory cells include the dummy memory cell 716 which is adjacent to a select gate transistor 717 and another dummy memory cell 715 which is between a data memory cell 714 and the dummy memory cell 716. To perform the weak programming, a program bias is provided for the dummy memory cells by the program circuit 150 of FIG. 1B.

The program bias can be provided by applying control gate voltages Vpgm1 and Vpgm2<Vpgm1 to the dummy memory cells 716 and 715, respectively. Example values are Vpgm1=12 V and Vpgm2=10 V in an initial erase loop. Concurrently, the select gate transistors receive a pass voltage as the control gate voltage. The pass voltage provides the select gate transistors in a conductive state so that electrons can enter the channel from the bit line and be drawn into the charge trapping regions of the dummy memory cells by the program bias. The program bias can be applied by applying control gate voltages to the dummy memory cells. These control gate voltages are typically lower than those used in programming data memory cells. The control gate voltages of the dummy memory cells can optionally increase as the erase operation progresses, in each successive erase loop, as described further below. This increase can apply to both the control gate voltages used for the program bias and the control gate voltages used for the erase bias.

During the application of the program bias to the dummy memory cells, an erase-verify voltage VvEr such as 1-2 V may be applied to the data word lines such as WLL9 and WLL10. This voltage is used during an erase-verify test for the dummy memory cells and applies to the example of FIG. 14A where the program bias occurs after the erase bias and before the erase-verify test. In the approach of FIG. 14C, where the program bias occurs after the erase-verify test, a pass voltage such as 8 V may be applied to the data word lines during the application of the program bias to the dummy memory cells.

The above features can be implemented by an apparatus comprising a plurality of sets of connected transistors arranged in a block, each set of connected transistors comprising a data memory cell, a dummy memory cell and a select gate transistor adjacent to the select gate transistor, each set of connected transistors comprising a continuous channel; circuitry (e.g., the erase circuit) configured to inject holes into the channels in an erase loop of an erase operation; and circuitry (e.g., the program circuit) configured to selectively inject electrons into portions of the channels within the dummy memory cells in the erase loop. The injection of electrons is selective because it is for the portions of the channels within the dummy memory cells rather than for the portions of the channels within the data memory cells. The circuitry configured to inject holes is configured to bias the data memory cell and the dummy memory cell with a positive channel-to-control gate voltage; and the circuitry configured to selectively inject electrons is configured to bias the dummy memory cell with a positive control gate-to-channel voltage which is higher than a concurrent control gate-to-channel voltage of the data memory cell.

FIG. 10A depicts a threshold voltage distribution of select gate transistors for a fresh memory device (plot 1000), for a cycled memory device with no programming of the dummy memory cells (plot 1001), for a cycled memory device with programming of the dummy memory cells after the erase-verify test (plot 1002), and for a cycled memory device with programming of the dummy memory cells before the erase-verify test (plot 1003) and after the erase pulse. The vertical axis depicts a number of SGD transistors on a log scale and the horizontal axis depicts Vth. This example involves the SGD transistor, although a similar situation can occur for the SGS transistors. Initially, the SGD transistors are programmed to have a Vth which is greater than a verify voltage, VvSGD, such as at the time of manufacture. See also FIG. 12B. The Vth distribution is represented by the plot 1000. As the block becomes cycled, e.g., as many P-E cycles are performed, the lower tail of the Vth distribution tends to downshift for reasons mentioned previously. The downshifted Vth is represented by the plot 1001. In this case, no countermeasure is performed to reduce the downshift.

Figure 14B:
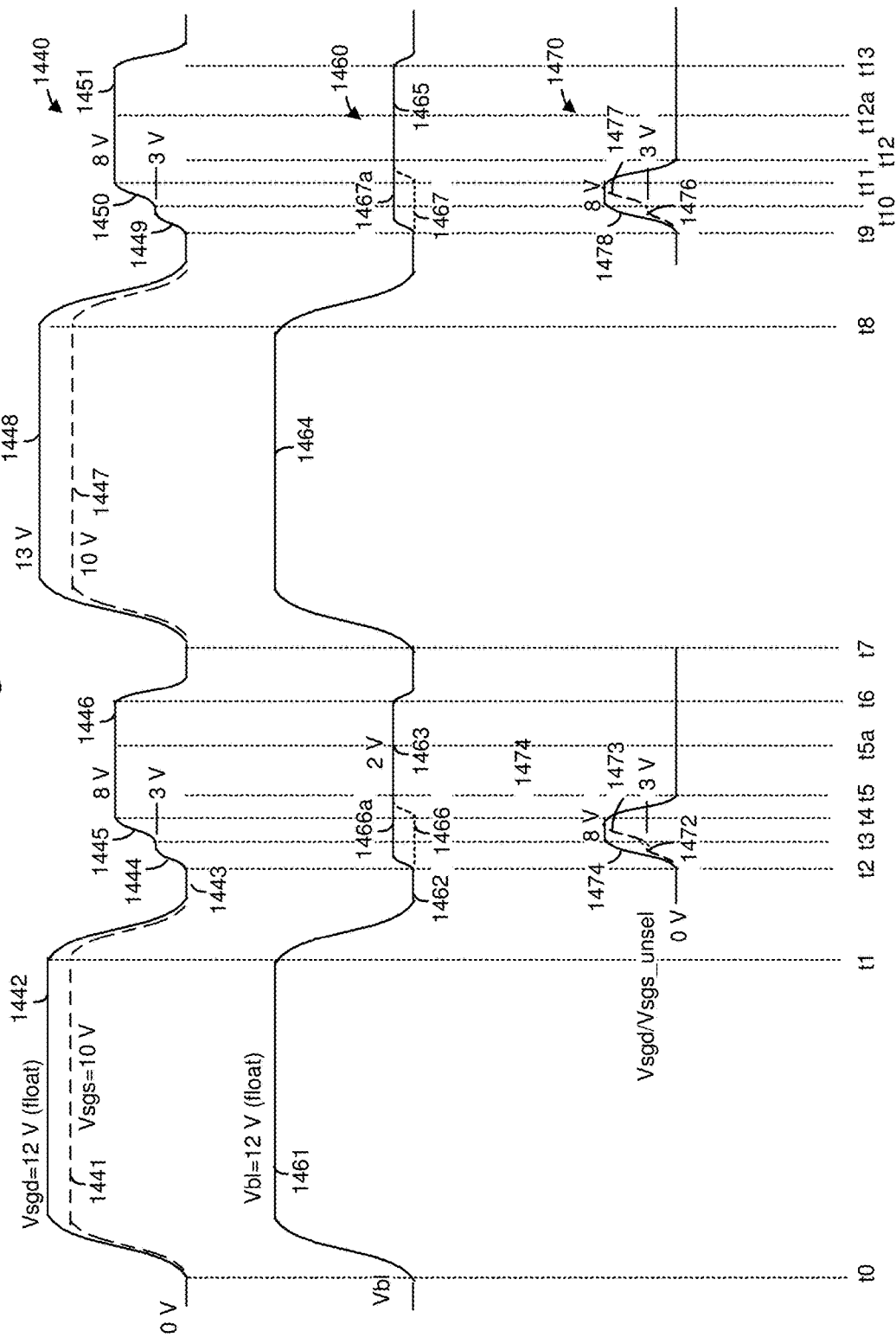
FIG. 14B depicts additional plots of example voltage signals used in an erase operation consistent with FIGS. 13A, 13B and 14A.

In contrast, plot 1002 represents the Vth distribution when a countermeasure is performed, where the countermeasure involves programming of the dummy memory cells after the erase-verify test, such as depicted in FIG. 14C. Plot 1003 represents the Vth distribution when a countermeasure is performed, where the countermeasure involves programming of the dummy memory cells before the erase-verify test, such as depicted in FIGS. 14A and 14B. Both countermeasures are effective in increasing the lower tail of the Vth distribution, although programming the dummy memory cells before the erase-verify test results in a larger improvement than programming the dummy memory cells after the erase-verify test. This shows that a shorter delay is preferred in injecting electrons into the charge trapping layer to recombine with the holes. Programming the dummy memory cells before the erase-verify test, during the setup of the voltages for the erase-verify test, can also avoid or minimize any time penalty.

One theory for the larger Vth downshift with the programming of the dummy memory cells after the erase-verify test (compared to before the erase-verify test) is that the verify voltage acts as a read stress which reinforces the coupling up of the dummy word line voltages, encouraging the movement of holes toward the select gate transistors.

The downshift in Vth has been observed in particular for SGD transistors in a 3D memory architecture consistent with FIG. 6A-8B, in which a set of connected memory cells are arranged in a NAND chain which extends vertically upward from a substrate. However, the SGS transistors are expected to experience a similar problem. The countermeasures described herein, including weak programming of dummy memory cells, are therefore applicable to both the source and drain side dummy memory cells.

FIG. 10B depicts a plot of fail bit count versus the voltage of the lower tail of the Vth distribution of FIG. 10A, showing how the fail bit count increases as the Vth is downshifted. The vertical axis depicts a number of fail bits, or memory cells in which an uncorrectable error occurs, on a log scale and the horizontal axis depicts the SGD lower tail Vth. As mentioned at the outset, errors can result when the Vth of the select gate transistors is not in a specified range. An uncorrectable error occurs when the assigned data state of a memory cell cannot be distinguished in a read operation, even after applying ECC techniques. This plot confirms that there is an increase in the number of errors if the SGD lower tail Vth downshifts. The countermeasures described herein can help avoid an increase in such errors.

FIG. 10C depicts a plot of an SGD lower tail Vth versus a number of program-erase cycles for the case of no programming of the dummy memory cells (plot 1010), programming of the dummy memory cells with a lower program voltage (plot 1011), and programming of the dummy memory cells with a higher program voltage (plot 1012). The vertical axis depicts the SGD lower tail Vth and the horizontal axis depicts a number of P-E cycles. As depicted in FIG. 10A, the SGD lower tail Vth downshifts over time as P-E cycles are performed. Each P-E cycle results in the injection of holes into the charge trapping layer of the dummy memory cells as well as an electric field which causes the holes to migrate towards the select gate transistors. Plot 1010 represents the largest downshift in the SGD lower tail Vth and corresponds to the case of no countermeasure, i.e., no weak programming of the dummy memory cells. Plot 1011 shows that the downshift in the SGD lower tail Vth is improved when there is some weak programming of the dummy memory cells. Plot 1012 shows that the downshift in the SGD lower tail Vth is improved further when there is a relatively stronger programming of the dummy memory cells. For example, the control gate voltage can be larger in the case of plot 1011 compared to plot 1010. There is a limit to how high the control gate voltage can be since the weak programming can become a strong programming which shifts the Vth of the dummy memory cells above an acceptable level. Generally, the weak programming should be sufficient to remove most of the holes in the charge trapping layer within the dummy memory cells without shifting the Vth of the dummy memory cells above an acceptable level.

FIG. 10D depicts a plot of a program voltage (Vpgm) for dummy memory cells as an increasing function of a number of program-erase cycles. The vertical axis depicts the Vpgm for the dummy memory cell and the horizontal axis depicts a number of P-E cycles for a block which contains the dummy memory cells. As depicted in FIG. 10A, when a block of memory cells is fresh and has few P-E cycles, there is little or no downshift in the SGD lower tail Vth. Accordingly, one approach (represented by plots 1020 and 1022) is to perform the weak programming of the dummy memory cells when the number of P-E cycles is at or above a specified level, PE1 and to not perform the weak programming of the dummy memory cells when the number of P-E cycles is below the specified level. Power can be saved by delaying the programming of the dummy memory cells until a block has been cycled. Another approach (represented by plots 1021 and 1022) involves phasing in the weak programming of the dummy memory cells between 0 and PE1. The Vpgm for the dummy memory cell gradually increases from zero or other low level to a maximum level of Vpgm1, for example.

In this example, a tracking circuit may be configured to track a number of program-erase cycles for a block comprising the set of connected transistors, wherein the program circuit applies the program bias for the dummy memory cell in response to the tracking circuit determining that a specified number of program-erase cycles (PE1) have been performed for the block.

The duration of the program voltage for the dummy memory cells can also be set as an increasing function of a number of program-erase cycles in a similar way as the magnitude.

FIG. 11 depicts an example Vth distribution of a set of memory cells after a program operation, where eight data states are used, and where program disturb is caused for the erase state memory cells due to a downshift in the Vth of a select gate transistor. The vertical axis depicts a number of memory cells, on a logarithmic scale, and the horizontal axis depicts a Vth of the memory cells on a linear scale. In one approach, at a start of the program operation, the memory cells are all initially in the erased state as represented by the Vth distribution 1100. After the program operation is successfully completed, the memory cells assigned to the Er state are represented by the Vth distribution 1108. The Vth distribution is upshifted due to program disturb, which in turn is caused by the downshift in the SGD lower tail Vth. The portion of the Vth distribution 1100 which is greater than VrA represents fail bits since the data state cannot be accurately determined for the associated memory cells, except for a small number of errors which can be corrected using an ECC process.

The memory cells which are to be programmed to the A, B, C, D, E, F and G states using verify voltages of VvA, VvB, VvC, VvD, VvE, VvF and VvG, respectively, are represented by the Vth distributions 1101, 1102, 1103, 1104, 1105, 1106 and 1107, respectively. The verify voltages are used in the program-verify tests of the memory cells. Read voltages VrA, VrB, VrC, VrD, VrE, VrF and VrG can be used for reading the states of the memory cells in a read operation. These verify voltages and read voltages are examples of control gate read levels of the selected word line voltage.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied to the word lines. FIGS. 13A and 13B provide further details of an erase operation.

FIG. 12A depicts a voltage signal used in a series of program loops in an example program operation of a data memory cell which results in the Vth distribution of FIG. 11. The horizontal axis denotes a program loop number, ranging from 1-22, and the vertical axis denotes voltage. During a program operation, program loops are performed for a selected word line in a selected block in each plane. A program loop comprises a program portion in which a program voltage or pulse is applied to the selected word line followed by a verify portion in which a verify signal is applied to the selected word line while one or more verify tests, referred to as program-verify tests, are performed for the associated memory cells. Other than the erased state, each assigned state has a verify voltage which is used in the verify test for the state in a program operation.

The voltage signal 1200 includes a series of program voltages, including an initial program voltage 1201, which are applied to a word line selected for programming In this example, the voltage signal includes program voltages which increase stepwise in amplitude in one or more program loops of a programming pass using a fixed or varying step size. This is referred to as incremental step pulse programming, where the program voltage starts at an initial level Vpgm_int_mc (see program voltage 1201) and increases in a step in each successive program loop, for instance, until the program operation is completed. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 1202, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification.

All memory cells may initially be in the erased state at the beginning of the program operation, for instance. After the program operation is completed, a Vth distribution similar to that in FIG. 11 ideally is achieved, and the data can be read from the memory cells using read voltages which are between the Vth distributions. At the same time, a read pass voltage, Vpass (e.g., 8-10 V), also referred to as pass voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

FIG. 12B depicts a voltage signal used in a series of program loops in an example program operation of a select gate transistor. As mentioned in connection with FIG. 10A, the select gate transistor may be programmed at the time of manufacture, and optionally at other subsequent times. The horizontal axis denotes a program loop number, ranging from 1-8, and the vertical axis denotes voltage. The programming of the select gate transistors is similar to the programming of the memory cells except typically a smaller initial program voltage, Vpgm_init_sgd (<Vpgm_int_mc), is used and the operation may be completed in fewer program loops. The voltage signal 1250 includes a series of program voltages, including an initial program voltage 1251, which are applied to a select gate control line which is selected for programming. The verify signal in each program loop, including example verify signal 1252, includes a program-verify voltage VvSGD. Note that, in some cases, there are multiple SGD transistors in a NAND chain. In this case, the SGD transistors can be programmed separately. Moreover, a same or different verify voltage can be used in the programming of the different SGD transistors of the NAND chain.

The step size can be different for the programming of the select gate transistors compared to the programming of the memory cells.

FIG. 13A depicts a process for erasing memory cells while weakly programming dummy memory cells to reduce a downshift in the Vth of the select gate transistors. The weak programming of the dummy memory cells is used as a countermeasure to prevent downshifts in the Vth of select gate transistors, as mentioned. Typically, an erase operation or process comprises a number of erase loops for a block. FIG. 14A provides example of two erase loops. The erase loops are performed until the erase operation is completed, e.g., as determined by erase-verify tests. In one approach, the erase-verify tests are performed on the data memory cells but not the dummy memory cells. The erase operation is completed when the data memory cells transition from the Vth distributions of the programmed data states, e.g., states A-G, to the erased state, as depicted in FIG. 11. A block of memory cells is a unit of erase such that a set of memory cells in a block can be erased concurrently. The set of memory cells may be arranged in a plurality of NAND chains and connected to a plurality of word lines. The erase operation can occur in response to an erase command which may be issued by a state machine or other control circuit. An erase loop comprises an erase phase follow by an erase-verify test. In the erase phase, voltages are applied to the block to provide an erase bias, e.g., a positive channel-to-gate voltage, for each memory cell of the block to drive electrons out of the charge-storing material of the memory cells, thereby reducing the Vth of the memory cells. An example erase occurs from t0-t1 and t7-t8 in FIGS. 14A and 14B and from t0-t1 in FIG. 14C.

A bias of a memory cell may refer to a voltage difference between the control gate and the channel of the memory cell. An erase bias for a memory cell occurs when the channel voltage is higher than the control gate voltage, as this condition causes an erase of the memory cell. A program bias for a memory cell occurs when the channel voltage is lower than the control gate voltage, as this condition causes a programming of the memory cell. To provide the erase bias, the channel voltage can be increased by applying an erase pulse to the substrate at the source end of a NAND chain. The erase pulse combined with a control gate voltage of the SGS transistor causes gate induced drain leakage (GIDL) at the SGS transistor. This generates holes in the channel of the NAND chain at the SGS. Since the channel is continuous in the NAND chain, e.g., the channel extends from the bottom of the NAND chain to the top of the NAND chain, and since the top of the NAND chain is at a lower voltage than the bottom of the NAND chain, the holes move in the channel toward the top of the NAND chain, increasing a voltage of the channel In an erase operation, charging up the channel can refer to increasing the voltage of the channel by applying an erase pulse to the channel, e.g., at the source end of the channel which is in contact with the substrate. The well voltage driver 430 of FIG. 4 can be used to apply the erase pulse.

After the erase bias is applied, the channel can be discharged. The discharging may refer to lowering the voltage of the channel to a level at or close to 0 V by removing the erase pulse and applying a voltage at or close to 0 V at the source and/or drain ends of the NAND chain. The discharging of the channel allows an erase-verify test to be performed by using the sense circuit to apply a small voltage to the NAND chain to generate a current in the NAND chain.

To provide the program bias for a memory cell, the channel voltage is set at or close to 0 V, typically by applying a low voltage on the bit line and providing the SGD transistors in a conductive state so that the bit line communicates with the channel Additionally, a program pulse is applied to the control gate voltage of the memory cell. The program pulse typically has a magnitude of several Volts. Moreover, the magnitude is smaller for a weak programming, such as is used for the dummy memory cells, compared to a normal programming, which is used for writing user data to the data memory cells. In the erase-verify test, a verify voltage is applied to the control gates of the memory cells via the word lines of the block, and sensing circuitry is used to sense currents in the NAND chains. An example erase-verify test occurs from t2-t6 and t9-t13 in FIGS. 14A and 14B, and from t2-t6 in FIG. 14C. For example, each NAND chain may be connected to a respective sense circuit via a respective bit line. The erase-verify test may occur for one sub-bock at a time. The erase-verify test for a sub-block is passed if at least a specified portion of the NAND chains in the sub-block, e.g., 90%, have a current above a reference level and are thus in a conductive state. The current in each NAND chain can be compared to a reference current.

Specifically, step 1300 includes beginning an erase operation for a block of memory cells. The erase operation may begin in response to an erase command which is issued by the controller 122 or the control circuitry 110, for example. For example, the controller 122 may decide to write user data to a block, where the block stores data which is no longer needed. The block is then erased to allow it the new user data to be written to it.

Step 1301 includes applying an erase bias for the memory cells, e.g., the data memory cells and the dummy memory cells. The erase bias can be applied by applying an erase pulse to the substrate and a relatively low voltage of about 0-2 V to the control gates of the memory cells. See, e.g., the erase pulses 1401 and 1403 in FIG. 14A and the erase pulse 1481 in FIG. 14C. Subsequently, one of two options can be followed. A first option includes step 1302, which involves performing weak programming of the dummy memory cells before performing erase-verify tests. The weak programming involves applying a control gate voltage for the dummy memory cells which is greater than the channel voltage, thus providing a positive gate-to-channel voltage. Step 1303 includes performing an erase-verify test.

A second option of FIG. 13A includes step 1306, which involves performing an erase-verify test before performing weak programming Step 1307 involves performing weak programming of the dummy memory cells. FIG. 10 provided examples of the benefits of either of these two options in decreasing the downshift of the SGD lower tail Vth.

A decision step 1304 determines whether the erase-verify tests for the block are passed. If the decision step is true, the erase operation is done at step 1305. If the decision step is false, a next erase loop is performed at step 1301. An erase-verify test can involve applying an erase verify voltage VvEr (FIG. 11) to the word lines while sensing a current in the NAND chains. If the current is sufficiently high, the NAND chain is considered to pass the erase-verify test. The block in turn passes the erase-verify test if all, or nearly all of the NAND chains pass the erase-verify test. The erase-verify test for a block can be performed one sub-block at a time, in one approach.

One option for an erase-verify test, depicted in FIG. 14A-14C, involves testing each of the data memory cells in each NAND chain of a sub-block concurrently. In this approach, an erase-verify voltage such as 1-2 V is applied to each data word line while a sense circuit detects the current level in each respective NAND chain. If the current is sufficiently high in all or most of the NAND chains, the sub-block passes the erase-verify test. Another option for an erase-verify test, depicted in FIG. 14D, involves testing the data memory cells in the even-numbered word lines separately from the data memory cells in the odd-numbered word lines. For example, an erase-verify voltage such as 1 V is applied to each even-numbered data word line while a sense circuit detects the current level in each respective NAND chain, and while a higher pass voltage such as 6 V is applied to the odd-numbered data word lines. The erase-verify voltage is then applied to each odd-numbered data word line while a sense circuit detects the current level in each respective NAND chain, and while a higher pass voltage such as 6 V is applied to the even-numbered data word lines. If the current is sufficiently high in all or most of the NAND chains for both even and odd numbered word lines, the sub-block passes the erase-verify test.

Other options for an erase operation can involve applying an erase pulse without performing an associated erase-verify test, for one or more erase loops.

FIG. 13B depicts an example implementation of the process of FIG. 13A. Step 1310 begins an erase loop in an erase operation. The erase loop includes an erase phase followed by an erase-verify test. Steps 1311 and 1312 are performed as part of a set up and recovery of voltages during the erase phase. Step 1311 includes applying an erase pulse having a voltage, Vsource, to the substrate, setting Vsgs=10 V, Vwl_data=0.5 V, Vwl_dd0=1.5 V, Vwl_dd1=1.0 V and floating Vbl and Vsgd. See also the example waveforms in FIG. 14A-14C. Vsgs is the control gate voltage of the SGS transistors. The example magnitude of 10 V is appropriate to charge up the channel using GIDL, as mentioned. Vwl_data is the control gate voltage of the data memory cells and the example magnitude of 0.5 V is a low level which allows for a large channel-to-gate voltage across the data memory cells to erase these memory cells. Vwl_dd0 is the control gate voltage of the dummy memory cells connected to WLDD0 (FIG. 7), which is adjacent to SGD transistors, and the example magnitude of 1.5 V is a low level which allows for a large channel-to-gate voltage across the dummy memory cells to erase these memory cells. Vwl_dd0 is slightly higher than Vwl_data to provide a slightly lower channel-to-gate voltage and thus a slightly weaker erase.

Vwl_dd1 is the control gate voltage of the dummy memory cells connected to WLDD1 (FIG. 7), which is not adjacent to the SGD transistors, and the example magnitude of 1 V is a low level which allows for a large channel-to-gate voltage across the dummy memory cells to erase these memory cells. Vwl_dd0 may be slightly higher than Vwl_dd1 to provide a slightly lower channel-to-gate voltage across these dummy memory cells and thus a slightly weaker erase that fewer holes are injected into the dummy memory cells of Vwl_dd0. This reduces the problem of holes migrating to the select gate transistors while still providing some erase of the dummy memory cells. Generally, the Vth of the dummy memory cells can increase slightly as the block is cycled due to disturbs, and the erase operation decreases the Vth back to a desired level which is typically higher than the desired erase Vth of the data memory cells. Vsgd is a common control gate voltage of the SGD transistors connected to SGD1(0) and SGD0(0) (FIG. 7) in this example.

Step 1311 includes the option to use step 1311a. Step 1311a involves increasing the control gate voltages of the dummy memory cells in successive erase loops. This can help avoid or reduce an increase in the strength of the erase of the dummy memory cells as the channel is charged up to higher levels in the successive erase loops. For a given channel voltage of a dummy memory cell, increasing the control gate voltage decreases the channel-to-gate voltage and therefore the strength of the erase process and the number of holes injected into the charge trapping layer of the dummy memory cells. If the channel voltage increases, increasing the control gate voltage can help keep the channel-to-gate voltage relatively constant.

Step 1312 includes ramping down the voltages to a steady state level Vss, such as 0 V.

Steps 1313 and 1314 are performed as part of a set up phase for the erase-verify test and add the countermeasure described herein of weak programming of dummy memory cells. One option involves configuring or setting up voltages for the erase-verify test while concurrently performing the weak programming Step 1313 includes ramping up Vsgs and Vsgd to, e.g., 8 V, Vwl_dd0 to Vpgm1 (e.g., 12 V), Vwl_dd1 to Vpgm2 (e.g., 10 V) and Vbl to 2 V, and setting Vwl_data to VvEr. The ramp up may be from an initial level of Vss. The 8 V level provides the select gate transistors in a conductive state so that sensing can occur based on the Vth of the data memory cells. Step 1313 includes the option to use step 1313a. Step 1313a involves increasing the peak control gate voltages of the dummy memory cells in successive erase loops. These peak control gate voltages are used for the weak programming of the dummy memory cells. This can help counter the increase in the strength of the erase process as the channel is charged up to higher levels in the successive erase loops. For a given channel voltage of a dummy memory cell, increasing the control gate voltage increases the gate-to-channel voltage and therefore the strength of the programming of the dummy memory cells. As more holes are injected into the charge trapping layer of the dummy memory cells as Vsource increases, an increased programming strength results in more electrons being drawn into the charge trapping layer of the dummy memory cells to recombine with the holes. Fewer holes are therefore available to migrate toward the select gate transistor and cause a Vth downshift, after the erase operation.

Step 1314 includes ramping down Vwl_dd0 and Vwl_dd1 from Vpgm1 and Vpgm2, respectively, to, e.g., 5 V. The 5 V level provides the dummy memory cells in a conductive state so that sensing can occur based on the Vth of the data memory cells. Step 1315 includes performing an erase-verify test for a sub-block. Step 1316 includes ramping down the voltages from the elevated levels to Vss.

Decision step 1317 determines whether a current sub-block (on which the erase-verify test is performed) passes the erase-verify test. If the decision step 1317 is false, a next erase loop begins at step 1310. If the decision step 1317 is true, a decision step 1318 determines whether all sub-blocks in the block have passed the erase-verify test. If the decision step 1318 is false, a next erase loop begins at step 1310. If the decision step 1318 is true, the erase operation is done at step 1319.

FIG. 14A depicts plots of example voltage signals used in an erase operation consistent with FIGS. 13A and 13B, where weak programming of the dummy memory cells occurs before the erase-verify test. In FIGS. 14A and 14B, the horizontal axes depicts a common time line and the vertical dimension denotes voltage. The example depicts two erase loops in a multi-loop erase operation. One or more erase loops can be used. A plot 1400 depicts an erase pulse or voltage, Vsource, applied to the source ends of the NAND chains at the substrate of a block. In a first erase loop, Vsource starts to increase from Vss to Verase1, e.g., 15 V, at t0, remains at Verase1 until t1, then starts to decreases back to Vss at t1. In a second erase loop, Vsource starts to increase from Vss to Verase2>Verase1, e.g., 16 V, at t7, remains at Verase2 until t8, then starts to decreases back to Vss at t8. Vsource is at Vss from t2-t7 and t9-t13 as depicted by plots 1402 and 1404, respectively. Verase1 and Verase2 are magnitudes of first and second erase pulses 1401 and 1403, respectively.

A plot 1405 depicts Vwl_dd0. It may be set at 1.5 V during the first and second erase pulses, as depicted by plots 1410 and 1416, respectively. Optionally, Vwl_dd0 is increased over the erase loops to a level such as 1.7 V in the second erase loop (plot 1417). By increasing Vwl_dd0 during the erase pulses over the erase loops while keeping Vwl_data fixed during the erase pulses over the erase loops, the erase biases for the dummy memory cells increase over the erase operation by a smaller amount than an increase in the erase biases for the data memory cells. The erase circuit may therefore be configured to apply erase biases for the data memory cell concurrent with the erase biases for the dummy memory cell in erase loops of the erase operation, wherein the erase biases for the data memory cell increase over the erase operation, and the erase biases for the dummy memory cell increase over the erase operation by a smaller amount than the increase in the erase biases for the data memory cell.

After each erase pulse, Vwl_dd0 is increased to a level for weak programming such as 12 V in the first and second erase loops. Optionally, Vwl_dd0 is increased over the erase loops to a level such as 12.5 V in the second erase loop. For example, after the first erase pulse is ramped down to Vss at t1, Vwl_dd0 increases from 0 V (plot 1411) to 12 V starting at t2. This provides a program pulse for the dummy memory cells. The magnitude and duration of the program pulse can be set as desired. This increase can be directly from 0 V to 12 V (plot 1412), or from 0 V to an intermediate voltage such as 3 V (plot 1413) starting at t2 and then from 3 V to 12 V (plot 1414) starting at t3. The intermediate voltage is between 0 V and the peak weak programming voltage of the erase loop. 3 V is an example of a voltage provided by the power supply voltage Vdd on the memory device. Increasing Vwl_dd0 in two (or more) steps instead of one step can reduce power consumption. After Vwl_dd0 reaches its peak level of 12 V, it starts to decrease to, e.g., 5 V at t4 and is stable at 5 V at t5 (plot 1415). The sensing of the data memory cells in the erase-verify test can then occur, e.g., at t5a. The sensing can involve all data word lines concurrently.

In one approach, the program circuit may operate according to clock cycles where the requested output voltage of a voltage driver can change in a clock cycle. In the approach of plots 1413 and 1414, the program circuit, to apply the program bias, is configured to request in a clock cycle that a voltage driver increase a control gate voltage of the dummy memory cell from an initial level (e.g. Vss or 0 V) to an intermediate level (e.g., Vdd or 3 V) and request in another, subsequent clock cycle that the voltage driver increase the control gate voltage from the intermediate level to a peak level (e.g., 12 V). In the approach of plot 1412, the program circuit, to apply the program bias, is configured to request in a clock cycle that a voltage driver increase a control gate voltage of the dummy memory cell from the initial level directly to the peak level.

Similarly, after the second erase pulse is ramped down to Vss at t8, Vwl_dd0 increases from 0 V to 12 V (plot 1418) or 12.5 V (plot 1419) starting at t9. The increase is directly from 0 V to 12 V or 12.5 V, in this example. After Vwl_dd0 reaches its peak level of 12 V or 12.5 V, it starts to decrease to 5 V at t11 and is stable at 5 V at t12 (plot 1420). The sensing of the data memory cells in the erase-verify test can then occur, e.g., at t12a.

A plot 1425 depicts Vwl_dd1. It may be set at 1 V during the first and second erase pulses, as depicted by plots 1426 and 1429, respectively. This example provides a weak programming for the associated dummy memory cells, even though they are not adjacent to the select gate transistors. However, the weak programming is weaker than for the dummy memory cells which are adjacent to the select gate transistors. This approach helps remove holes which could migrate to the select gate transistors while minimizing a potential inadvertent increase in the Vth of an adjacent data memory cell. It also helps to keep the dummy memory cells at a similar Vth by providing a comparable amount of weak programming.

After each erase pulse, Vwl_dd1 is increased to a level for weak programming such as 10 V in the first and second erase loops. Optionally, Vwl_dd0 is increased over the erase loops to a level such as 10.5 V (not shown) in the second erase loop. For example, after the first erase pulse is ramped down to Vss at t1, Vwl_dd1 increases from 0 V directly to 10 V starting at t2 (plot 1427). The increase could alternatively occur in multiple steps, as mentioned in connection with Vwl_dd0. After Vwl_dd1 reaches its peak level of 10 V, it starts to decrease to 5 V at t4 and is stable at 5 V at t5 (plot 1428).

Similarly, after the second erase pulse is ramped down to Vss at t8, Vwl_dd1 increases from 0 V to 10 V starting at t9 (plot 1430). After Vwl_dd1 reaches its peak level of 10 V, it starts to decrease to 5 V at t11 and is stable at 5 V at t12 (plot 1431).

Optionally, weak programming is not used for WLDD1, in which case Vwl_dd1 is increased from 0 V to 5 V, for example, without reaching a higher weak programming voltage such as 10 V.

For the dummy memory cells, the weak programming voltage may be higher than the pass voltage used during the erase-verify test.

Plot 1430 depicts the voltage on the data word lines, Vwl_data. Vwl_data may be set at a low level such as 0.5 V during the first and second erase pulses (see plots 1431 and 1433, respectively). Vwl_data may be set at 1-2 V (e.g., VvEr) during the erase-verify tests which occur at t5a and t12a (see plots 1432 and 1434, respectively).

FIG. 14B depicts additional plots of example voltage signals used in an erase operation consistent with FIGS. 13A, 13B and 14A. Plot 1440 depicts the select gate voltages Vsgd and Vsgs. In one embodiment, these voltages apply to all Vsgd and Vsgs transistors in a block from t0-t1 and t7-t9, when the erase pulse is applied. These voltage signals may apply to a selected sub-block from t1-t7 and after t9, when an erase-verify test is performed. The voltage signals of plot 1470 may apply to an unselected sub-block from t1-t7 and after t9.

In one approach, as mentioned, Vsgs may be driven at about 10 V (plot 1441) while Vsgd is floated to about 12 V (plot 1442) during the first erase loop. In the second erase loop, the channel voltage is slightly higher than in the first erase loop because Vsource is greater. As a result, Vsgd is slightly higher than in the first erase loop, e.g., 13 V. Vsgs and Vsgd are represented by plots 1447 and 1448, respectively. After each erase pulse, Vsgs and Vsgd can be set at a pass voltage level such as 8 V which facilitates the weak programming of the dummy memory cells and the subsequent erase-verify test.

In the first erase loop, after Vsgs and Vsgd are ramped down to Vss at t1 (plot 1443), they increase from 0 V to 8 V starting at t2. This increase can be directly from 0 V to 8 V (not shown), or from 0 V to 3 V (plot 1444) starting at t2 and then from 3 V to 8 V (plot 1445) starting at t3. After Vsgs and Vsgd reach their peak level of 8 V (plot 1446), the erase-verify test is performed, and then Vsgs and Vsgd start to decrease to Vss at t6.

In the second erase loop, after Vsgs and Vsgd are ramped down to Vss at t8, they increase from 0 V to 8 V starting at t9. This increase can be directly from 0 V to 8 V (not shown), or from 0 V to 3 V (plot 1449) starting at t9 and then from 3 V to 8 V (plot 1450) starting at t10. After Vsgs and Vsgd reach their peak level of 8 V (plot 1451), the erase-verify test is performed, and then Vsgs and Vsgd start to decrease to Vss at t13.

Plot 1460 depicts the bit line voltage, Vbl. Vbl may float to a similar level as Vsgd, e.g., 12 V, during the first and second erase pulse, e.g., as shown by plots 1461 and 1464. Vbl may also be set at a level such as 2 V during the first and second erase-verify tests, e.g., as shown by plots 1463 and 1465. Vbl may be returned to 0 V at other times such as depicted by plot 1462. In one option (plot 1466a and 1467a), Vbl increases from an initial level such as 0 V to a positive voltage (2 V) which is used during the erase-verify test at t2 and t9, so that Vbl is at the positive voltage during the weak programming pulse. In this approach, Vbl can be set to the desired level for the erase-verify test quickly and the increase in Vbl occurs during the weak programming pulse so that no additional time is used in providing the weak programming pulses. In another option (plots 1466 and 1467), Vbl increases from the initial level to the positive voltage which is used during the erase-verify test at t4 and t11, so that Vbl is at the lower initial level during the weak programming pulse. The increase in Vbl from an initial level to a positive voltage used during sensing is thus delayed until after the weak programming pulse. This helps increase the strength of the programming of the dummy memory cells (by increasing the gate-to-drain voltage) and the number of electrons injected into their charge trapping layers.

The features of plots 1466 and 1467 can be implemented by a voltage driver which is configured to increase a voltage of a bit line from an initial level, e.g., Vss or 0 V, to a positive level, e.g., 2 V, used for the erase-verify test, after the program bias is applied to the dummy memory cells.

Plot 1470 depicts the voltage of Vsgd and Vsgs for an unselected sub-block (Vsgd/Vsgs_unsel). An unselected sub-block is a sub-block in which the erase-verify test is not currently being performed. Increasing Vsgd and/or Vsgs for these select gate transistor to provide them temporarily in a conductive state can help discharge the associated channel regions to avoid disturbs.

In the first erase loop, Vsgd/Vsgs increase from 0 V to 8 V starting at t2. This increase can be directly from 0 V to 8 V (plot 1474), or from 0 V to 3 V (plot 1472) starting at t2 and then from 3 V to 8 V (plot 1473) starting at t3. After Vsgd/Vsgs_unsel briefly reach their peak level of 8 V, they are ramped back down to 0 V before the erase-verify test is performed at t5a. With Vsgd/Vsgs_unsel=0 V, the select gate transistors in the unselected sub-block are non-conductive so that they do not interfere with the erase-verify test in the selected sub-block.

In the second erase loop, Vsgd/Vsgs increase from 0 V to 8 V starting at t9. This increase can be directly from 0 V to 8 V (plot 1478), or from 0 V to 3 V (plot 1476) starting at t9 and then from 3 V to 8 V (plot 1477) starting at t10. After Vsgd/Vsgs_unsel briefly reach their peak level of 8 V, they are ramped back down to 0 V before the erase-verify test is performed at t12a.

FIG. 14C depicts plots of example voltage signals used in an erase operation consistent with FIG. 13A, where weak programming of the dummy memory cells occurs after the erase-verify test. Only one erase loop, e.g., the first erase loop, is shown for simplicity. Plot 1480 shows that Vsource starts to increase from 0 V to Verase1 at t0, remains at Verase1 until t1 (see erase pulse 1481), then ramps down to 0 V starting at t 1, and remains at 0 V (plot 1482) during the erase verify test at t5a and during the weak programming of the dummy memory cells at t7-t8.

Plot 1485 shows that Vwl_dd0 increases to 1.5 V (plot 1486) from t041 as in FIG. 14A, returns to 0 V from t1-t2, increases to 5 V at t2-t6 (plot 1487) for the sensing of the erase-verify test at t5a, returns to 0 V at t6-t7, then increases briefly to 12 V (plot 1488) to provide the weak programming pulse before returning to 0 V again at t8.

Plot 1490 shows that Vwl_dd1 increases to 1 V (plot 1491) from t041 as in FIG. 14A, returns to 0 V from t1-t2, increases to 5 V at t2-t6 (plot 1492) for the sensing of the erase-verify test at t5a, returns to 0 V at t6-t7, then increases briefly to 10 V (plot 1493) to provide the weak programming pulse before returning to 0 V again at t8.

Plot 1495 shows that Vwl_data increases to 0.5 V (plot 1496) from t041 as in FIG. 14A, then returns to 0 V from t1-t2. Vwl_data then increases from 0 V to 1-2 V at t2-t6 8 (plot 1497) for the sensing of the erase-verify test at t5a. Vwl_data then decreases back to 0 V at t6.

Figure 14D:
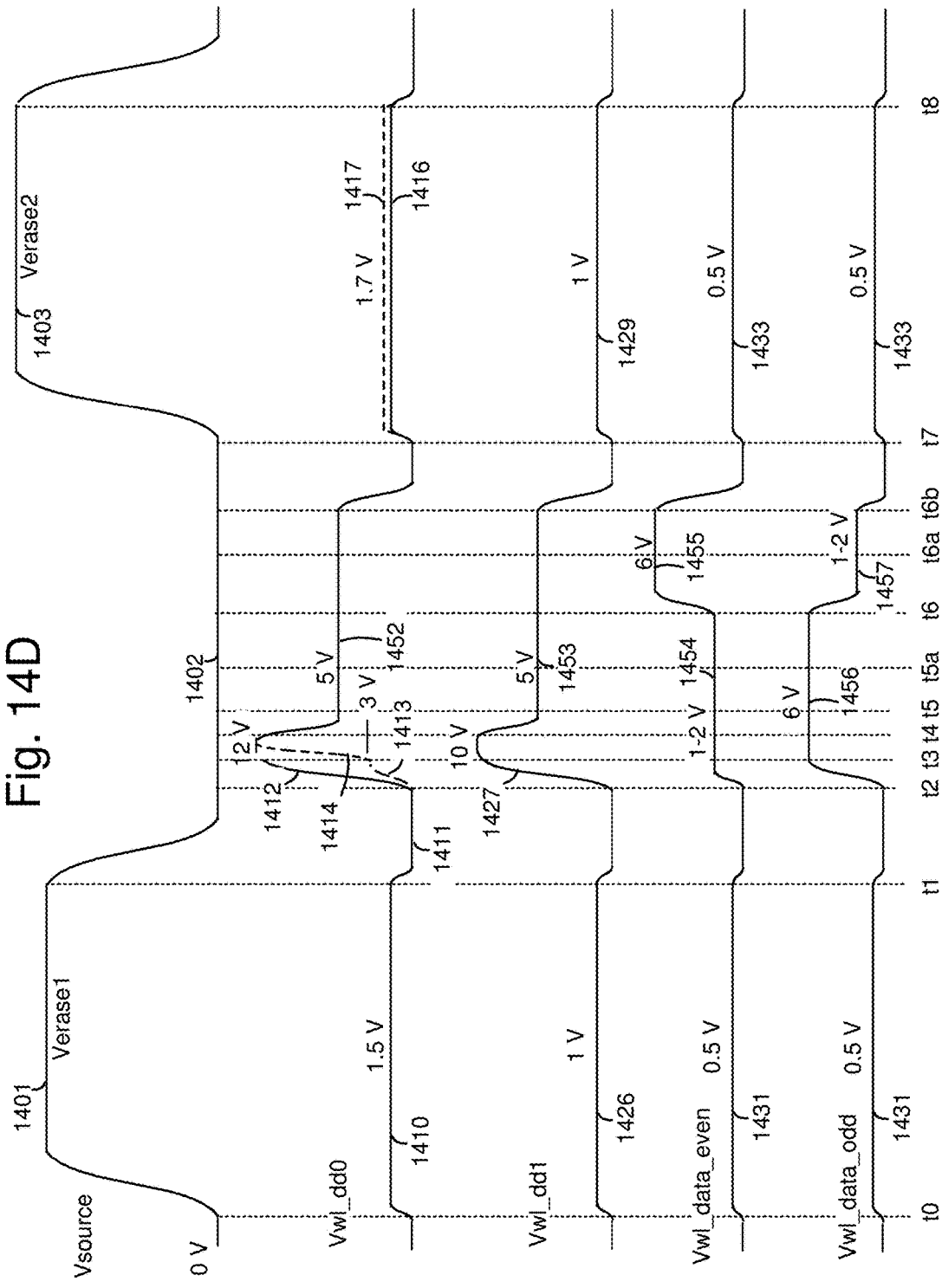
FIG. 14D depicts plots of example voltage signals used in an erase operation consistent with FIGS. 13A and 13B, where weak programming of the dummy memory cells occurs before the erase-verify test, and where an erase-verify test for even-numbered word lines is performed separately from an erase-verify test for odd-numbered word lines.

FIG. 14D depicts plots of example voltage signals used in an erase operation consistent with FIGS. 13A and 13B, where weak programming of the dummy memory cells occurs before the erase-verify test, and where an erase-verify test for even-numbered word lines is performed separately from an erase-verify test for odd-numbered word lines. As mentioned in connection with FIG. 13A, one option for an erase-verify test involves testing the data memory cells in the even-numbered word lines separately from the data memory cells in the odd-numbered word lines. The horizontal axes depicts a common time line and the vertical dimension denotes voltage. Like-numbered plots correspond to those in FIG. 14A. The time period depicted encompasses the erase portion (t041) and erase-verify portion (t2-t6b) of one erase loop, followed by the erase portion (t7-t8) of another erase loop. The time periods t045 and t7-t8 correspond to the same time periods in FIG. 14A. In the erase-verify portion, weak programming of the dummy memory cells occurs from t2-t4 and sensing occurs at t5a for even-numbered data word lines and at t6a for odd-numbered data word lines.

After the weak programming pulse of plot 1412 or 1413 and 1414, Vwl_dd0 and Vwldd1 decrease to 5 V, for example, (plots 1452 anad 1453, respectively) and hold this level from t5-t6b. From t2-t6, Vwl_data_even, the voltage on the even-numbered data word lines is set at VvEr=1-2 V, for example (plot 1454) while Vwl_data_odd, the voltage on the odd-numbered data word lines is set at a pass level of 6 V, for example (plot 1456). After the sensing at t5a for the data memory cells connected to the even-numbered data word lines, Vwl_data_even increases from 1-2 V to 6 V while Vwl_data_odd decreases from 6 V to 1-2 V at t6. From t6-t6b, Vwl_data_even is set at 6 V (plot 1455) while Vwl_data_odd is set at 1-2 V (plot 1457). After the sensing at t6a for the data memory cells connected to Vwl_data_odd, Vwl_data_even decreases from 6 V to 0 V while Vwl_data_odd decreases from 1-2 V to 0 V.

FIG. 15A depicts a plot of example waveforms in a programming operation, showing coupling up of a word line voltage, where the coupled up word line voltage can cause the hole migration of FIG. 9B, as discussed. As mentioned, e.g., in connection with FIG. 9B, the control gate or word line voltage of the memory cells can be floated to a level such as 5 V after a program, read or erase operation. This results in an electric field which causes holes to move toward the SGD transistors and cause charge loss. FIGS. 15A and 15B describe the floating which occurs after a program operation and FIGS. 15C and 15D describe the floating which occurs after a read operation.

The time period shown represents one program-verify iteration or loop. The horizontal axis depicts time and the vertical axis depicts word line voltage, Vwl. A program voltage 1500 is applied to a selected word line from t0-t4 and reaches a magnitude of Vpgm. The program voltage can temporarily pause at an intermediate level such as Vpass to avoid a single large transition which can have undesired coupling effects. A pass voltage 1505 is applied to the unselected word lines from t0419 and reaches a magnitude of Vpass, which is sufficiently high to provide the memory cells in a conductive state so that the sensing (e.g., verify) operations can occur for the memory cells of the selected word line. The pass voltage includes an increasing portion, a fixed amplitude portion, for instance, at Vpass and a decreasing portion. Optionally, the pass voltage may be increased sooner relative to the program voltage so that Vpass is reached by t0.

A verify voltage 1510 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The sense circuits may be activated during each verify voltage. The waveform decreases from VvG, or from a voltage slightly higher than VvG, to 0 V or other steady state level from t15-t16.

For the unselected word lines, the decrease in Vpass will cause the memory cells to transition from a conductive state to a non-conductive state. In particular, when the Vpass falls below a cutoff level, Vcutoff (the dotted line at t18), the channel of the memory cell will become cutoff, e.g., the memory cell will become non-conductive. When a memory cell becomes non-conductive, it acts as a capacitor in which the control gate is one plate and the channel is another plate. A memory cell becomes non-conductive when Vcg<Vcutoff or Vcg<(Vth+Vsl), where Vcg is the control gate voltage of the memory cell (the word line voltage), Vth is the threshold voltage of the memory cell and Vsl is the source line voltage which in turn is approximately the voltage at the source terminal of the memory cell. For a memory cell in the highest programmed state, e.g., the G state, the Vth can be as low as VvG (or lower due to post-programming charge loss) and as high as the Vth at the upper tail of the G state in the Vth distribution 1207 in FIG. 12. Vcutoff can therefore be as low as VvG+Vsl or as high as Vth of G state upper tail+Vsl. As the pass voltage 1505 decreases from Vcutoff to 0 V, the channel is capacitively coupled down by a similar amount, as represented by plot 1515 in FIG. 15B.

The voltage swing while the channel is cutoff will be larger when Vsl is larger. However, since Vch=Vsl, the minimum downcoupled level of Vch will be essentially independent of Vsl. For example, a 6 V swing in the word line voltage (e.g., Vcutoff=6 V) with Vsl=1 V will result in about the same minimum downcoupled level of Vch as a 5 V swing in the word line voltage (e.g., Vcutoff=5 V) with Vsl=0 V.

The plot 1512 represents the coupling up of the word line voltages from t19-t20. The coupling up is depicted as occurring relatively quickly but this is not to scale. In practice, the verify operation, e.g., from t5-t19, may consume about 100 microseconds, while the coupling up of the word line may be significantly longer, in the millisecond range such as 10 milliseconds.

FIG. 15B depicts a plot of a channel voltage (Vch) corresponding to FIG. 15A. For an unselected NAND chain (a NAND chain not having a memory cell which is programmed in the current program loop), Vch will be boosted to a level such as 8 V (not shown) during the program voltage, e.g., from t044. This boosting is achieved by providing the SGD and SGS transistors of the unselected string in a non-conductive state to cause Vch to float. Vch is coupled higher due to capacitive coupling when Vpass and Vpgm are applied to the word lines. For a selected NAND chain (a NAND chain having a memory cell which is programmed in the current program loop), Vch is typically grounded as shown during the program voltage.

During the verify voltages, Vch may be initially at about 1 V, for instance, for a selected NAND chain. Vch is about the same as Vsl for the channels of the selected NAND chains. Vsl is set based on a type of sensing which is used. Examples include negative sensing in which Vsl is about 1 V and positive sensing in which Vsl is about 0 V and a negative word line voltage is used. The techniques described herein apply regardless of the level of Vsl or the type of sensing used.

The channel is capacitively coupled down to a minimum level from t18-t19 and then begins to return to a final level of, e.g., 0 V from t19-t20. If the voltages of the word lines are allowed to float starting at t19, the voltages (plot 1512) are capacitively coupled higher by the increase in Vch. The voltages of the word lines float to a peak level of Vwl_coupled_up, e.g., about 5 V, thereby reaching the second read condition. For example, Vcutoff may be 6 V, so that there is a 6 V change in the word line voltage, e.g., 6-0 V, which is coupled to the channel. With the initial value of Vch at 1 V and a 90% coupling ratio, the minimum Vch may be about 1-6×0.9=−4.4 V, for instance. Accordingly, there is a 4.4 V increase in Vch which is coupled to the word line, e.g., control gate, of the memory cells. Vwl_coupled_up may be about 4.4×0.9=4 V. The voltages of the word lines are floated by disconnected the word lines from a word line driver.

FIG. 15C depicts a plot of example waveforms in a read operation, showing coupling up of a word line voltage, where the coupled up word line voltage can cause the hole migration of FIG. 9B. A read operation is similar to a verify operation as both are sensing operations and both can provide a coupling up of the word line voltages. The horizontal axis depicts time and the vertical axis depicts word line voltage, Vwl. Pass voltages 1530, 1531 and 1532 are applied to the unselected word lines from t0-t3, t4-t8 and t9-t12, respectively, and have a magnitude of Vpass. The pass voltage includes an increasing portion, a portion at Vpass and a decreasing portion. A read voltage includes separate waveforms 1520 (at levels of VrA and VrE), 1521 (at levels of VrB, VrD and VrF) and 1522 (at levels of VrC and VrG) for each of the lower, middle and upper pages, respectively, consistent with FIG. 12. The read voltages are optimized for the second read condition, as an example, and are applied to the selected word line. An eight-level memory device is used in this example.

For the unselected word lines, the decrease in Vpass will cause the memory cells to transition from a conductive state to a non-conductive state, as discussed. The dotted line at t13 indicates when a G state cell becomes non-conductive. As the pass voltage 1532 decreases from Vcutoff to 0 V, the channel is capacitively coupled down by a similar amount, as represented by the plot 1535 in FIG. 15D. As the channel voltage increases after t14, the word line voltages are floated and are coupled higher, to Vwl_coupled_up.

Coupling up can also occur after an erase operation. At the end of the erase-verify operation, both Vsgd and Vsgs ramp down and cut off the channel when their control gate voltage falls below their Vth, e.g., 2 V (or higher in some cases). When the select gate voltage continues to decrease to 0 V, the channel potential, especially under the SGD transistor and the DD0 dummy memory cell, is down coupled due to gate-to-channel coupling. This is an unstable situation since Vbl=0 V, so that electron-hole pairs are generated in the channel. The channel potential returns to about 0 V, causing coupling up of the control gate of the dummy memory cell to about 2 V. The down coupling and associated coupling up is greater when the Vth of the select gate transistor is higher.

FIG. 15D depicts a plot of a channel voltage (Vch) corresponding to FIG. 15C. The channel is capacitively coupled down to a minimum level of Vch_min from t13-t14 and then begins to return to a final level of, e.g., 0 V from t14-t15. If the voltages of the word lines are allowed to float starting at t14, the voltages (plot 1532) are capacitively coupled higher by the increase in Vch (plot 1535). The voltages of the word lines float to a peak level of Vwl_coupled_up, as discussed.

In one implementation, an apparatus comprises: a set of connected transistors comprising a data memory cell, a dummy memory cell and a select gate transistor, wherein the dummy memory cell is adjacent to the select gate transistor; an erase circuit configured to provide apply erase biases separated in time for the dummy memory cell during an erase operation; and a program circuit configured to apply a program bias for the dummy memory cell between the erase biases. For example, the erase bias in a first erase loop can be provided by Verase1 at the substrate and Vw_dd0=1.5 V on the control gate, for the dummy memory cell 716, from t0-t1 in FIG. 14A. The erase bias in a second erase loop can be provided by Verase2 at the substrate and Vw_dd0=1.5 V or 1.7 V on the control gate from t7-t8 in FIG. 14A. These erase biases are separated in time by the time period t1-t7. The program bias is provided by the control gate voltage Vwl_dd0 from t2-t4 and is therefore between the erase biases. A similar explanation can be provided for the example of FIG. 14C where the program bias is after the erase-verify test. The program bias for the dummy memory cell can be between successive erase biases of an erase operation.

In another implementation, a method comprises: receiving an erase command; and in response to the erase command: charging up a channel of a set of memory cells while fixing control gate voltages of the memory cells to apply a positive channel-to-control gate voltage for the memory cells, the set of memory cells comprises a dummy memory cell positioned adjacent to a select gate transistor, the set of memory cells also comprises a data memory cell; discharging the channel; and after the discharging, providing a control gate-to-channel voltage for the dummy memory cell which is greater than a control gate-to-channel voltage for the data memory cell.

In another implementation, an apparatus comprises: means for erasing a set of memory cells in an erase loop of a multi-loop erase operation; and means for selectively programming one or more memory cells of the set of memory cells positioned adjacent to select gate transistors, during the erase loop.

The means for erasing may include the erase circuit 151 of FIG. 1B, or other logic hardware, and/or other executable code stored on a computer readable storage medium or device. Other embodiments may include similar or equivalent means.

The means for selectively programming may include the program circuit 150 of FIG. 1B, or other logic hardware, and/or other executable code stored on a computer readable storage medium or device. Other embodiments may include similar or equivalent means.

The means for erasing comprises means for applying an erase pulse to the substrate, and means for applying a control gate voltage to the one or more memory cells while the erase pulse is applied to the substrate, wherein the control gate voltage applied to the one or more memory cells is incremented over the erase loops of the erase operation.

The means for applying a control gate voltage may include the erase circuit 151 of FIG. 1B, or other logic hardware, and/or other executable code stored on a computer readable storage medium or device. Other embodiments may include similar or equivalent means.

In another implementation, an apparatus comprises: a plurality of sets of connected transistors arranged in a block, each set of connected transistors comprising a data memory cell, a dummy memory cell and a select gate transistor adjacent to the select gate transistor, each set of connected transistors comprising a continuous channel; circuitry configured to inject holes into the channels in an erase loop of an erase operation; and circuitry configured to selectively inject electrons into portions of the channels within the dummy memory cells (e.g., portions 912a and 913a in FIG. 9C) in the erase loop.

In another implementation, a system comprises: a controller; a substrate; a NAND chain comprising a select gate transistor, a dummy memory cell adjacent to the select gate transistor and a data memory cell, a bottom of the NAND chain is in contact with the substrate; a first voltage driver (e.g., the well voltage driver 430 of FIG. 4) connected to the substrate; a second voltage driver (e.g., one of the dummy WL drivers 449-449c of FIG. 4) connected to the dummy memory cell; and a third voltage driver (e.g., the data WL drivers 447 and 448 of FIG. 4) connected to the data memory cell. The controller, in response to an erase command for the data memory cell, is configured to instruct the first voltage driver to apply an erase pulse to the substrate, instruct the second voltage driver to apply a control gate voltage to the dummy memory cell at a level which causes erasing while the erase pulse is applied to the substrate, and instruct the third voltage driver to apply a control gate voltage to the data memory cell at a level which causes erasing while the erase pulse is applied to the substrate, and after the erase pulse is applied to the substrate, the controller is configured to apply a control gate voltage to the dummy memory cell at a level which causes programming.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a set of connected transistors comprising a data memory cell, a dummy memory cell and a select gate transistor, wherein the dummy memory cell is adjacent to the select gate transistor;
   an erase circuit configured to apply erase biases separated in time for the dummy memory cell during an erase operation; and
   a program circuit configured to apply a program bias for the dummy memory cell between the application of the erase biases.

2. The apparatus of claim 1, wherein the erase circuit is configured to apply erase biases for the data memory cell concurrent with the application of the erase biases for the dummy memory cell, the apparatus further comprising:
   a voltage driver configured to increase a control gate voltage of the data memory cell to a level used for an erase-verify test during the application of the program bias for the dummy memory cell.

3. The apparatus of claim 1, wherein:
   during the application of the program bias for the dummy memory cell, the program circuit is configured to apply no program bias, or a program bias which is smaller than the program bias for the dummy memory cell, for the data memory cell.

4. The apparatus of claim 1, wherein the erase circuit is configured to apply erase biases for the data memory cell concurrent with the application of the erase biases for the dummy memory cell, the apparatus further comprising:
   a sense circuit configured to perform an erase-verify test for the data memory cell between the application of the erase biases for the data memory cell, wherein the program bias for the dummy memory cell is applied before the erase-verify test is performed; and
   a voltage driver configured to increase a control gate voltage of the select gate transistor to a level used for the erase-verify test during the application of the program bias for the dummy memory cell.

5. The apparatus of claim 1, further comprising:
   a tracking circuit configured to track a number of program-erase cycles for a block comprising the set of connected transistors, wherein the program circuit applies the program bias for the dummy memory cell in response to the tracking circuit determining that a specified number of program-erase cycles have been performed for the block.

6. The apparatus of claim 1, further comprising:
   a tracking circuit configured to track a number of program-erase cycles for a block comprising the set of connected transistors, wherein the program circuit, to apply the program bias, is configured to apply a control gate voltage to the dummy memory cell, and to set a magnitude of the control gate voltage as an increasing function of the number of program-erase cycles.

7. The apparatus of claim 1, wherein:
   the erase circuit, to apply the erase bias, is configured to apply an erase pulse to a source-end of the set of connected transistors, wherein a magnitude of the erase pulse increases over the erase operation; and
   the program circuit, to apply the program bias, is configured to apply a control gate voltage to the dummy memory cell, wherein a magnitude of the control gate voltage increases over the erase operation.

8. The apparatus of claim 1, wherein:
   the erase circuit is configured to apply erase biases for the data memory cell concurrent with the application of the erase biases for the dummy memory cell in erase loops of the erase operation, wherein the erase biases for the data memory cell increase over the erase operation, and the erase biases for the dummy memory cell increase over the erase operation by a smaller amount than the increase in the erase biases for the data memory cell.

9. The apparatus of claim 1, wherein:
   the program circuit, to apply the program bias, is configured to request in a clock cycle that a voltage driver increase a control gate voltage of the dummy memory cell from an initial level to an intermediate level and request in another, subsequent clock cycle that the voltage driver increase the control gate voltage from the intermediate level to a peak level.

10. The apparatus of claim 1, wherein:
    the program circuit, to apply the program bias, is configured to request in a clock cycle that a voltage driver increase a control gate voltage of the dummy memory cell from an initial level directly to a peak level.

11. The apparatus of claim 1, wherein:
    the set of connected transistors comprises another dummy memory cell, the another dummy memory cell is between the data memory cell and the dummy memory cell which is adjacent to the select gate transistor; and
    during the application of the erase biases for the dummy memory cell which is adjacent to the select gate transistor, the erase circuit is configured to apply erase biases for the another dummy memory cell which are greater than the erase biases for the dummy memory cell which is adjacent to the select gate transistor.

12. The apparatus of claim 1, wherein:
    the set of connected transistors comprises another dummy memory cell, the another dummy memory cell is between the data memory cell and the dummy memory cell which is adjacent to the select gate transistor; and
    during the application of the program bias for the dummy memory cell which is adjacent to the select gate transistor, the program circuit is configured to apply no program bias, or a program bias which is smaller than the program bias for the dummy memory cell which is adjacent to the select gate transistor, for the another dummy memory cell.

13. The apparatus of claim 1, wherein:
the erase circuit is configured to apply erase biases for the data memory cell concurrent with, and greater than, the erase biases for the dummy memory cell.

14. The apparatus of claim 1, wherein the erase circuit is configured to apply erase biases for the data memory cell concurrent with the application of the erase biases for the dummy memory cell, the apparatus further comprising:
a bit line connected to the set of connected transistors;
a sense circuit configured to perform an erase-verify test for the data memory cell between the application of the erase biases for the data memory cell, wherein the program bias for the dummy memory cell is applied before the erase-verify test is performed; and
a voltage driver configured to increase a voltage of the bit line from an initial level to a positive level used for the erase-verify test, after the program bias is applied to the dummy memory cell.

15. A method, comprising:
receiving an erase command; and
in response to the erase command:
charging up a channel of a set of memory cells while applying control gate voltages to the memory cells erase the memory cells, the set of memory cells comprises a dummy memory cell positioned adjacent to a select gate transistor, the set of memory cells also comprises a data memory cell; and
after the erasing, providing a control gate-to-channel voltage for the dummy memory cell which is greater than a control gate-to-channel voltage for the data memory cell.

16. The method of claim 15, wherein:
the charging up of the channel occurs in each erase loop of a multi-loop erase operation;
a charged up voltage of the channel increases over the multi-loop erase operation; and
a control gate voltage for the dummy memory cell increases over the multi-loop erase operation.

17. An apparatus, comprising:
means for erasing a set of memory cells in an erase loop of a multi-loop erase operation; and
means for selectively programming one or more memory cells of the set of memory cells positioned adjacent to select gate transistors, during the erase loop; wherein:
the set of memory cells are in a NAND chain;
a bottom of the NAND chain is connected to a substrate; and
the means for erasing comprises means for applying an erase pulse to the substrate, and means for applying a control gate voltage to the one or more memory cells while the erase pulse is applied to the substrate, wherein the control gate voltage applied to the one or more memory cells is incremented over the erase loops of the erase operation.

18. An apparatus, comprising:
a plurality of sets of connected transistors arranged in a block, each set of connected transistors comprising a data memory cell, a dummy memory cell and a select gate transistor adjacent to the select gate transistor, each set of connected transistors comprising a continuous channel;
circuitry configured to inject holes into the channels in an erase loop of an erase operation; and
circuitry configured to selectively inject electrons into portions of the channels within the dummy memory cells in the erase loop.

19. The apparatus of claim 18, wherein:
the circuitry configured to inject holes is configured to bias the data memory cell and the dummy memory cell with a positive channel-to-control gate voltage; and
the circuitry configured to selectively inject electrons is configured to bias the dummy memory cell with a positive control gate-to-channel voltage which is higher than a concurrent control gate-to-channel voltage of the data memory cell.

20. A system, comprising:
a controller;
a substrate;
a NAND chain comprising a select gate transistor, a dummy memory cell adjacent to the select gate transistor and a data memory cell, a bottom of the NAND chain is in contact with the substrate;
a first voltage driver connected to the substrate;
a second voltage driver connected to the dummy memory cell; and
a third voltage driver connected to the data memory cell;
the controller, in response to an erase command for the data memory cell, is configured to instruct the first voltage driver to apply an erase pulse to the substrate, instruct the second voltage driver to apply a control gate voltage to the dummy memory cell at a level which causes erasing while the erase pulse is applied to the substrate, and instruct the third voltage driver to apply a control gate voltage to the data memory cell at a level which causes erasing while the erase pulse is applied to the substrate, and after the erase pulse is applied to the substrate, the controller is configured to apply a control gate voltage to the dummy memory cell at a level which causes programming.

* * * * *